(12) United States Patent
Cola et al.

(10) Patent No.: US 10,859,330 B1
(45) Date of Patent: Dec. 8, 2020

(54) FLEXIBLE AND CONFORMABLE POLYMER-BASED HEAT SINKS AND METHODS OF MAKING AND USING THEREOF

(71) Applicant: Carbice Corporation, Atlanta, GA (US)

(72) Inventors: Baratunde Cola, Atlanta, GA (US); Craig Green, Atlanta, GA (US)

(73) Assignee: CARBICE CORPORATION, Atlanta, GA (US)

( * ) Notice: Subject to any disclaimer, the term of this patent is extended or adjusted under 35 U.S.C. 154(b) by 0 days.

(21) Appl. No.: 16/560,610

(22) Filed: Sep. 4, 2019

Related U.S. Application Data

(63) Continuation of application No. 16/553,209, filed on Aug. 28, 2019.

(51) Int. Cl.
*F28F 21/06* (2006.01)
*H02S 40/42* (2014.01)
*H05K 7/20* (2006.01)
*H01L 23/373* (2006.01)
*H05K 9/00* (2006.01)

(52) U.S. Cl.
CPC .......... *F28F 21/065* (2013.01); *F28F 21/067* (2013.01); *H01L 23/3737* (2013.01); *H02S 40/42* (2014.12); *H05K 7/20409* (2013.01); *F28F 2275/025* (2013.01); *H05K 9/0007* (2013.01)

(58) Field of Classification Search
CPC .. F28F 21/065; F28F 21/067; F28F 2275/025; H01L 23/3737; H05K 7/20409
See application file for complete search history.

(56) References Cited

U.S. PATENT DOCUMENTS

| | | |
|---|---|---|
| 2,243,979 A | 6/1941 | Reynolds |
| 3,234,683 A | 2/1966 | Christiansen |
| 3,640,017 A | 2/1972 | Christiansen |
| D244,632 S | 6/1977 | Christiansen |
| 4,064,300 A | 12/1977 | Bhangu |
| 5,057,903 A | 10/1991 | Olla |
| 5,102,829 A | 4/1992 | Cohn |
| D327,185 S | 6/1992 | Ryaa |
| 5,763,296 A | 6/1998 | Casati |
| D398,295 S | 9/1998 | Chang |
| 5,991,155 A | 11/1999 | Kobayashi |
| 6,142,847 A | 11/2000 | Rudy |

(Continued)

FOREIGN PATENT DOCUMENTS

| | | |
|---|---|---|
| CN | 303114809 | 2/2015 |
| CN | 303114811 | 2/2015 |

(Continued)

OTHER PUBLICATIONS 140 mm Pin Din Heatsink Square Shapes, https://www.alibaba.com/product-detail/140mm-Pin-Fin-Heatsink-Square-Shapes_60775112298.html, accessed Oct. 2, 2019.

(Continued)

*Primary Examiner* — Jon T. Schermerhorn, Jr.

(74) *Attorney, Agent, or Firm* — Pabst Patent Group LLP

(57) ABSTRACT

Heat sinks containing polymeric protrusions on a base and optionally further including a foil or tape, as well as methods of making and using thereof, are described herein.

30 Claims, 10 Drawing Sheets

(56) References Cited

U.S. PATENT DOCUMENTS

| | | |
|---|---|---|
| 6,221,463 B1 | 4/2001 | White |
| 6,250,127 B1 | 6/2001 | Polese |
| 6,367,541 B2 | 4/2002 | McCullough |
| D487,544 S | 3/2004 | Jessen |
| 6,724,071 B2 | 4/2004 | Combs |
| 6,800,932 B2 | 10/2004 | Lam |
| 6,919,504 B2 * | 7/2005 | McCutcheon ...... F28D 15/0241 174/16.3 |
| 6,921,462 B2 | 7/2005 | Montgomery |
| 6,965,513 B2 | 11/2005 | Montgomery |
| 7,086,451 B2 | 8/2006 | Leu |
| 7,173,823 B1 | 2/2007 | Rinehart |
| D576,185 S | 9/2008 | Park |
| 7,465,605 B2 | 12/2008 | Raravikar |
| 7,828,827 B2 | 11/2010 | Gartstein |
| D647,959 S | 11/2011 | Takaghi |
| 8,093,715 B2 | 1/2012 | Xu |
| 8,220,530 B2 | 7/2012 | Cola |
| 8,226,625 B2 | 7/2012 | Turner |
| 8,377,364 B2 | 2/2013 | Shiomitsu |
| D694,226 S | 11/2013 | Thompson |
| D694,703 S | 12/2013 | Faro |
| 9,097,468 B2 | 8/2015 | Chen |
| D792,183 S | 7/2017 | Miller |
| D822,625 S | 7/2018 | Tamura |
| 10,037,930 B2 | 7/2018 | Kume |
| D839,253 S | 1/2019 | Su |
| 10,297,523 B2 | 5/2019 | Hong |
| D865,876 S | 11/2019 | Webber |
| 2002/0140336 A1 | 10/2002 | Stoner |
| 2003/0183379 A1 | 10/2003 | Krassowski |
| 2004/0027816 A1 | 2/2004 | Ice |
| 2004/0065717 A1 | 4/2004 | Saijo |
| 2004/0105807 A1 | 6/2004 | Fan |
| 2004/0118579 A1 | 6/2004 | McCutcheon |
| 2004/0125266 A1 | 7/2004 | Miyauchi |
| 2004/0184981 A1 | 9/2004 | Liu |
| 2004/0261987 A1 | 12/2004 | Zhang |
| 2005/0214197 A1 | 9/2005 | Gu |
| 2005/0228097 A1 | 10/2005 | Zhong |
| 2006/0073089 A1 | 4/2006 | Ajayan |
| 2006/0231970 A1 | 10/2006 | Huang |
| 2007/0253889 A1 | 11/2007 | Awano |
| 2008/0095695 A1 | 4/2008 | Shanov |
| 2008/0149166 A1 | 6/2008 | Beeson |
| 2008/0160866 A1 | 7/2008 | Zhang |
| 2008/0236804 A1 | 10/2008 | Cola |
| 2008/0241755 A1 | 10/2008 | Franklin |
| 2008/0292840 A1 | 11/2008 | Majumdar |
| 2009/0032496 A1 | 2/2009 | Yao |
| 2009/0246507 A1 | 10/2009 | Graham |
| 2010/0006272 A1 | 1/2010 | Braun |
| 2010/0027221 A1 | 2/2010 | Iwai |
| 2010/0053892 A1 | 3/2010 | Wang |
| 2011/0020593 A1 | 1/2011 | Winkler |
| 2011/0067841 A1 | 3/2011 | Doo |
| 2011/0086464 A1 | 4/2011 | Kim |
| 2011/0103021 A1 | 5/2011 | Janssen |
| 2012/0018134 A1 | 1/2012 | Polk, Jr. |
| 2012/0090563 A1 | 4/2012 | Thijssen |
| 2012/0128880 A1 | 5/2012 | Talapatra |
| 2012/0132410 A1 | 5/2012 | Gu |
| 2012/0217257 A1 | 8/2012 | Ting |
| 2012/0325430 A1 | 12/2012 | Chen |
| 2013/0153189 A1 | 6/2013 | Lin |
| 2013/0234313 A1 | 9/2013 | Wainerdi |
| 2013/0256868 A1 | 10/2013 | Aliyev |
| 2013/0284404 A1 | 10/2013 | Matsushima |
| 2014/0015158 A1 | 1/2014 | Cola |
| 2014/0083671 A1 | 3/2014 | Ideguchi |
| 2015/0047822 A1 | 2/2015 | Lin |
| 2015/0245523 A1 | 8/2015 | Takagi |
| 2015/0338176 A1 | 11/2015 | Chen |
| 2016/0069622 A1 | 3/2016 | Alexiou |
| 2016/0091260 A1 | 3/2016 | Schultz |
| 2016/0158825 A1 | 6/2016 | Inoshita |
| 2017/0018478 A1 | 1/2017 | Maple |
| 2017/0280588 A1 | 9/2017 | Wu |
| 2017/0363375 A1 | 12/2017 | Mayor |
| 2018/0087846 A1 | 3/2018 | Remsburg |
| 2018/0149436 A1 | 5/2018 | Lee |
| 2018/0151472 A1 | 5/2018 | Chen |
| 2018/0359886 A1 | 12/2018 | Lin |
| 2018/0363893 A1 * | 12/2018 | Cheng ............... F21V 29/70 |
| 2019/0139863 A1 | 5/2019 | Tamura |
| 2019/0219313 A1 | 7/2019 | Draenkow |
| 2019/0221501 A1 | 7/2019 | Tamura |
| 2019/0237382 A1 | 8/2019 | Kim |
| 2019/0302325 A1 | 10/2019 | Sorbel |
| 2019/0369294 A1 | 12/2019 | Chang |

FOREIGN PATENT DOCUMENTS

| | | |
|---|---|---|
| CN | 302015674 | 8/2015 |
| EP | 0662244 | 7/1995 |
| EP | 2251302 | 11/2010 |
| EP | 001318182003 | 3/2012 |
| JP | 34324772 | 8/2003 |
| JP | D1465458 | 3/2013 |
| JP | 2013115094 | 6/2013 |
| JP | 2015041768 | 3/2015 |
| KR | 3008331680000 | 1/2016 |
| KR | 3009927820000 | 2/2019 |
| WO | 1996006321 | 2/1996 |
| WO | 2013007645 | 1/2013 |
| WO | 2017087136 | 5/2017 |

OTHER PUBLICATIONS

Bayer, et al., Support-Catalyst-Gas interactions during carbon nanotube growth on metallic ta films, J Phys. Chem., 115:4359-69 (2011).

Cola, et al., "Contact mechanics and thermal conductance of carbon nanotube array interfaces", Int. J. Heat Mass Trans., 52:3490-3503 (2009).

Cu/Al Pin Fin Heat Sink_Heat Sink_Jacarlos Industries Co. Ltd., www.jacarlosworld.com/view/asp?id=159, 1-2, accessed Oct. 2, 2019.

Dagan, et al., "Hybrid heat sinks provide optimal cooling for embedded systems", https://www/embedded.com/print/4027004, 1-5, (2009).

Dai, et al., "Controlled growth and modification of vertically-aligned carbon nanotubes for multifunctional applications", Mater. Sci. Eng., 70:63-91 (2010).

Hildreth, et al., "Conformally coating vertically aligned carbon nanotube arrays using thermal decomposition of iron pentacarbonyl", J Vac Sci Technol. B, 30(3):03D1011-03D1013 (2012).

Kim, et al., "Evolution in catalyst morphology leads to carbon nanotube growth termination", J Phys. Chem. Lett, 1:918-22 (2010).

Learn How AlSiC substrates Offer CTE matching for Thermal Dissipation, https://www.indium.com/blog/learn-how-alsic-substrates-offer-cte-matching-for-thermal-dissipation.php, 1-4, (2010).

Sleasman, et al., "Cool Running Autos", https;//powersystemsdesign.com/articles/cool-running-autos/22/5339, 1-6, (2010).

U.S. Appl. No. 16/021,562, filed Jun. 28, 2018. (unpublished application).

MIT News, "Better surfaces could help dissipate heat", Published Jun. 26, 2012. http://news.mkit.edu/2012/better-heat-transfer-0626 (2012).

Research Micro Stamps, "shop", Cached 02 May 18, 2017 https://researchmicrostamps.com/shop-online/ (2017).

Thermocool, "Copper base bonded fin heatsink", first accessed on Jul. 6, 201, (https://thermocoolcorp.com/project/copper-base-bonded-fin-heatsink/) (2017).

Toshiba Machine, "Micro-Pattern Imprinting Machine ST Series", Feb. 28, 2015 http://www.toshiba-machine.co.jp/en/product/nano/lineup/st/imprint.html (2015).

Yaglioglu, et al., "Contact Testing of Copper Micro-pillars with Very Low Damage for 3D IC Assembly", 2013 IEEE International Conference on 3D System Integration, (2013).

(56) References Cited

OTHER PUBLICATIONS

Youmin, et al., "Microfabrication of Short Pin Fins on Heat Sink Surfaces to Augment Heat Transfer Performance", 13th IEEE ITherm Conference, (2012).

Youtube, "TCP3D Flexible 3D Printed Composite Heat Sink for SSD, LEDs, CPUs, etc.", Uploaded by TCPoly on Jan. 25, 2018 (Https://www.youtube.com/watch?v=ta2wQrOql4) (2018).

* cited by examiner

FLEXIBLE AND CONFORMABLE POLYMER-BASED HEAT SINKS AND METHODS OF MAKING AND USING THEREOF

CROSS-REFERENCE TO RELATED APPLICATIONS

This application is a continuation of U.S. Ser. No. 16/553,209 filed Aug. 28, 2019 and claims the benefit of and priority to U.S. Ser. No. 16/553,209 filed Aug. 28, 2019, and is incorporated by reference in its entirety.

FIELD OF THE INVENTION

This invention is in the field of polymer-based heat sinks and methods of making and using thereof.

BACKGROUND OF THE INVENTION

Heat sinks are used to conduct thermal energy away from a heat-generating devices, such as computer chips. Heat sinks typically include aluminum or other metal extrusions as a common form of heat sink. These extrusions have a rigid base and extended surface area fins. Other versions of metal heat sinks are used and can include flexible copper foils in various shapes, which optionally may have electrically insulating coatings on one or both major surfaces.

Heat sink assemblies, however, suffer from several disadvantages when employing a rigid heat sink. They typically require the use of gap pads or gap fillers between the heat sink and the heat-generating device which result in poor thermal transfer uniformity, particularly where the group of devices to be cooled have a great degree of variance of height. Gap pads can suffer from varying degrees of thermal conductivity because the thermal conductivity through the thickness of gap pad is proportional to the amount of compression of the pad. In general, use of a gap pad can result in non-uniform thermal transfer causing overall inferior thermal conductivity.

Plastic-based heat sinks have also been used, in addition to metal heat sinks. Due to the low thermal conductivity of plastics and polymers used to make such heat sinks, these polymers/plastics contain thermal conductive additives and fillers in order to increase the thermal conductivity of the resulting heat sink. The inclusion of such additives and fillers can have detrimental effects on the mechanical properties of plastic-based heat sinks, such as rendering them brittle and unattractive in appearance to the consumer.

For at least the foregoing reasons, there is a demand for heat sinks that are capable of dissipating heat from heat-generating devices formed of plastics and polymers and which are not rigid.

Therefore, it is an object of the present invention to provide heat sinks which are formed from suitable plastics or polymers and which are flexible and conformable.

SUMMARY OF THE INVENTION

Heat sink articles include a plurality of polymeric protrusions extending away from a base, as described herein.

In general, a heat sink includes a plurality of polymeric protrusions where the polymeric protrusions extend away from a base. In some other instances, a heat sink includes a plurality of polymeric protrusions where the polymeric protrusions extend away from a base and a foil or tape is also present below the base. The details of the aforementioned are described in detail below.

In some instances the heat sinks can further include a foil or tape present below the base and the foil or tape is made of or contains a metal or graphite having a high thermal conductivity. The foil or tape present on the base can be free or substantially free carbon nanotubes in some instances wherein in "substantially free" means less than 5%, 4%, 3%, 2%, 1%, 0.9%, 0.8%, 0.7%, 0.6%, 0.5%, 0.4%, 0.3%, 0.2%, 0.1%, or less. In other instances, the foil or tape present on the base can include carbon nanotubes, as described further below.

The heat sinks, with or without a foil or tape present, described herein can reduce steady state delta T (temperature difference) between surface(s) on which the heat sink is disposed on and the ambient by at least a factor of about 3, 2.75, 2.5, 2.25, 2, 1.75, 1.5, or 1.25 times. The heat sinks, with or without a foil or tape present below the base, are conformable and flexible. The heat sinks can be curved around a surface of a device, such as of a heat generating device. The heat sink can conform to a device's dimensions or components thereof, and can deform or deflect under an installation force. The heat sinks, with or without a foil or tape, can conform, flex, and/or curve to contact all of the desired surface of a heat generating device (except for the roughness of the surface and heat sink) which is to be contacted with the heat sink or substantially all of the surface desired and traps no or a minimum amount of air or voids and provides contact between the surface interfaces contacted by the heat sink's base layer.

The base of the heat sinks may additionally include one or more optional additional layer(s) thereon. Additional optional layer(s) which may form part of the base or be placed on a surface of the base include, for example, a backing layer which can provide further functionality, such as to stabilize and/or reinforce the heat sink, provide resistance to stretching, improve tear resistance, add additional electrical isolation or electrical conductivity/grounding as well as a variety of other functions.

The heat sinks described herein can be formed according to the methods detailed below. In one non-limiting example, the method of preparing a heat sink includes the steps of:

(a) forming a base and a plurality of polymeric protrusions on at least a surface of the base.

In another non-limiting example, the method of preparing a heat sink includes the steps of:

(a) forming a base and a plurality of polymeric protrusions at least a surface of the base; and (b) attaching, adhering, or bonding to the base a foil or tape on a surface opposite the surface including the plurality of polymeric protrusions.

The heat sinks formed according to the methods can have any suitable dimensions needed to cover one or more surfaces of a heat-generating device.

The heat sinks described herein are flexible and conformable. Accordingly, such heat sinks are well suited for applications where the heat sink can conform to heat sources or heat-generating devices (or components thereof). The heat source or heat generating device or component thereof can be a computer chip, computer module, a multi-component system, memory module, graphics chip, radar and radiofrequency (RF) device, disc drive, display, light-emitting diode (LED) display, lighting device, pipe, automotive control unit, solar cell, solar panels, electromagnetic interference (EMI) enclosures, battery, communications device, thermoelectric generator, an imaging device, cellular phone, tablet or handheld computer, power or signal amplifier, AC/DC converter or other power electronics device. The heat sinks described above, in certain instances, may further include an optional lid placed on top of the polymeric protrusions of the heat sinks.

The heat sinks may also be attached to sources of waste heat, such as hot pipes for temperature control or energy extraction. The heat sink can be abutted or adhered to the heat generating device or source to improve the transfer of heat from the heat generating device or source. The heat sinks are well suited for fitting into complex and/or volume constrained devices, sources, components, or packages. The flexible and conformable heat sinks allow for intimate contact between surface(s) of heat generating devices or sources, as the surfaces may be curved, bent, bowed, or be otherwise deformed by design or due to thermal expansion(s) of the devices or sources.

The heat sinks may be dielectric and may be used in the vicinity of electronic components that require isolation from adjacent components without the need for additional measures such as the application of dielectric tapes or films that may increase cost or interfere with heat transfer.

In certain embodiments, the heat sinks may be used at temperatures which are above ambient temperature, at ambient temperature, below ambient temperature, below freezing, or at cryogenic temperatures.

The heat sinks can also be used for reducing unwanted antenna effects that may propagate electromagnetic and/or radio frequency signals.

The heat sinks may be used to conform around obstacles such as adjacent components on a printed circuit board, or an electromagnetic interference (EMI) shielding enclosure, without the need for a gap filling pad to make up the difference in height between the heat generating component and the obstacles near said component. With a sufficiently low profile of, for example, less than 10 mm, the heat sink may be placed inside of an EMI shielding enclosure, as opposed to above the enclosure or penetrating the enclosure's lid. When placed inside an EMI enclosure the need to include holes or other penetrations in the lid of the enclosure, or gap pads to make contact to the lid of the enclosure is eliminated.

The heat sinks may form part of a larger flexible structure for use in a device, such as a cellular phone or tablet, which requires heat removal or dissipation thereof from heat generating component(s) therein. The heat sink portion of the structure is designed to navigate heat away from the heat-generating component(s) where the heat escapes the device. The structure can provide a protective cover for the device and refers to an enclosure, or housing, that can also protect the device in the event the device is dropped. The larger flexible structure which the heat sink is a part of can be formed of any suitable material (i.e., plastic, wood, metal, etc.) and may be formed to dimensions suited for any commercially available device. The heat sink can be positioned on an interior surface of the structure which contacts one or more heat generating surfaces of a device (for example, a back surface which heats up during operations and/or charging). The polymeric protrusions of the heat sink typically face away from the device's heat generating surface(s) and the base, optionally including a foil or tape, are in direct or indirect contact with all or at least a portion of the device's heat generating surface(s). The heat sink forming part of the larger structure may prevent overheating of the device.

The heat sinks described may be attached to radiator panels in spacecraft, satellites, or other systems reliant on radiative cooling to increase surface area for heat rejection and associated heat transfer rates.

DETAILED DESCRIPTION OF THE INVENTION

I. Definitions

Figure 1A:
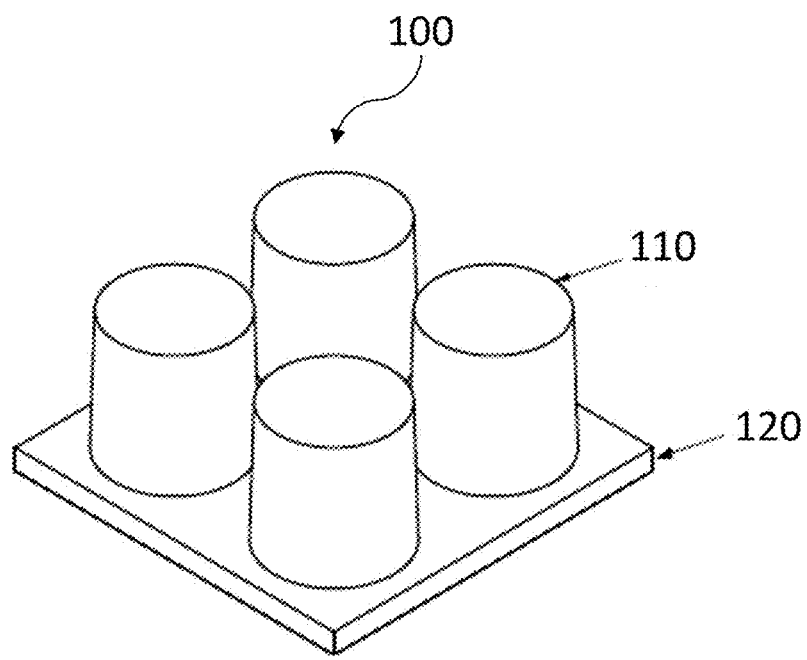
FIG. 1A shows a non-limiting schematic of a heat sink 100 including a plurality of polymeric protrusions 110 where the polymeric protrusions extend away from a base 120.

"Conformable," "Deformable," "Compliant," or "Compliance," are used interchangeably herein, and refer to the ability to conform or deform when a heat sink is contacted, typically under an applied pressure (i.e., compression force), to one or more surfaces. Conformance to the asperities, curvature, and/or nonplanarity of the adjoining surface(s) results in sufficient or high contact areas at the interfaces between the surfaces and the conformed heat sink. Heat sinks possess the ability to conform when contacted to one or more surfaces resulting in high contact areas at interfaces between such surfaces and the heat sink.

"Flexible," as used herein, refers to the ability to deform/conform in response to an applied force, strain, or stress.

"Thermally Non-Conductive" or "Low Thermal conductivity," are used interchangeably and refer to a material, such as a polymer, having a thermal conductivity in the range of about 0.01 to 0.5 W/m-K or which less than about 0.5 W/m-K.

"Thermally Conductive" as used herein, refers to a material, such as a metal, having a thermal conductivity of 5 W/m-K or greater.

"Elastic recovery" as used herein, refers to the ability of a material to return to its original shape following compression, expansion, stretching, or other deformation.

"Compression set" as used herein, refers to the permanent deformation of a material which remains when a force, such as compression, was applied to the material and the force was subsequently removed.

Numerical ranges disclosed in the present application include, but are not limited to, ranges of temperatures, ranges of pressures, ranges of molecular weights, ranges of integers, ranges of conductance and resistance values, ranges of times, and ranges of thicknesses. The disclosed ranges of any type, disclose individually each possible number that such a range could reasonably encompass, as well as any sub-ranges and combinations of sub-ranges encompassed therein. For example, disclosure of a pressure range is intended to disclose individually every possible pressure value that such a range could encompass, consistent with the disclosure herein.

Use of the term "about" is intended to describe values either above or below the stated value, which the term "about" modifies, in a range of approx. +/−10%; in other instances the values may range in value either above or below the stated value in a range of approx. +/−5%. When the term "about" is used before a range of numbers (i.e., about 1-5) or before a series of numbers (i.e., about 1, 2, 3, 4, etc.) it is intended to modify both ends of the range of numbers or each of the numbers in the series, unless specified otherwise.

II. Heat Sinks

Heat sink articles include a plurality of polymeric protrusions extending away from a base, as described below. The plurality of polymeric protrusions extending away from the base increases the heat transfer ability of the heat sink, as compared to a heat sink without polymeric protrusions. In some instances, the heat transfer is increased by about 10%, 20%, 30%, 40%, 50%, 60%, 70%, 80%, 100%, 200%, 500%, 1,000%, or greater, as compared to a heat sink not having polymeric protrusions extending away from a base.

Figure 1B:
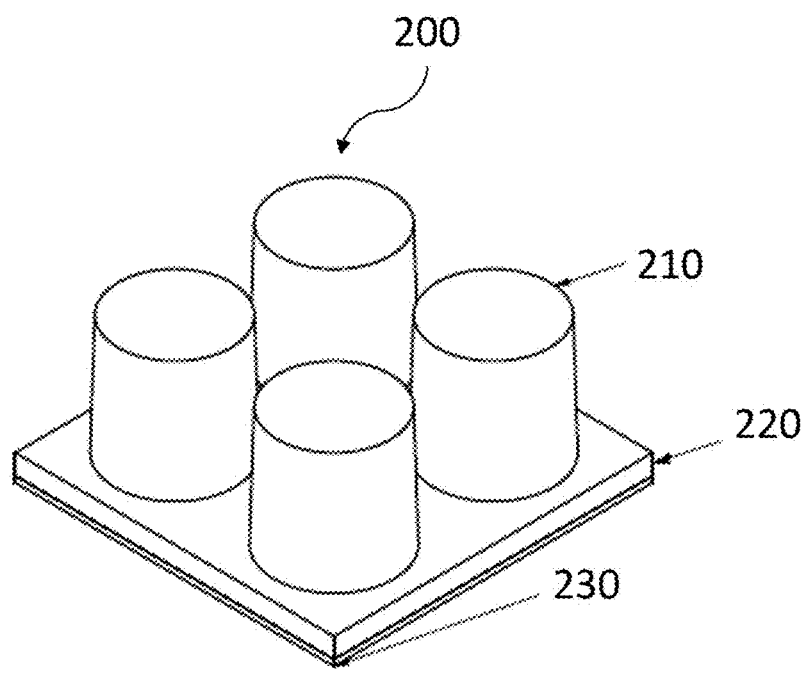
FIG. 1B shows a non-limiting schematic of a heat sink 200 including a plurality of polymeric protrusions 210 where the polymeric protrusions extend away from a base 220 and a foil or tape 230 is present below the base.

As shown in FIG. 1A, a heat sink 100 includes a plurality of polymeric protrusions 110 where the polymeric protrusions extend away from a base 120. In some other instances, as shown in FIG. 1B, a heat sink 200 includes a plurality of polymeric protrusions 210 where the polymeric protrusions extend away from a base 220 and where a foil or tape 230 is also present below the base.

In some instances, the polymeric protrusions and the base form a single polymer piece. The polymeric protrusions and base can be made from any suitable polymer, such as, but are not limited to, melt processable or extrudable polymer(s). Suitable examples include, but are not limited to, thermoplastic polymers, elastomeric polymers, thermosetting polymers, and thermoplastic elastomers. Two or more polymers may be used in combination, such as in layers and/or blends to form the polymeric protrusions. The thermoset polymers used to form the protrusions, for example, can be cross-linked via known means, such as chemical or thermal agents, catalysts, irradiation, heat, light, and combinations thereof. In some instances, the polymer(s) used to form the protrusions may be selected such that it has a glass transition temperature below about 25° C. in order for the polymer to not be completely hard and glassy at room temperature. In some instances, the polymeric protrusions and the base can be formed of one or more polymers, including but not limited to, those from the group consisting of polycarbonates, nylons, polypropylenes, styrene-ethylene-butylene-styrene or other styrenic block copolymers, polyurethanes, polyethylene terephthalate (including biaxially-oriented polyethylene terephthalate also known as Mylar), or blends thereof. In some instances, a phase change material (PCM), such as a paraffin wax, may be included inside (i.e., a core) of the polymeric protrusions to increase the thermal storage capacity. Phase change materials include, but are not limited to, paraffin waxes, polyethylene waxes, hydrocarbon-based waxes in general, and blends thereof. Other examples of phase change materials that are neither wax nor polymeric include liquid metals, oils, organic-inorganic and inorganic-inorganic eutectics, and blends thereof. The polymeric protrusions and the base are typically formed as a single piece whereas in other instances a base may be formed first and the polymeric protrusions may be added thereto. In the latter case, the base and the polymeric protrusions may be formed of different polymers (listed above).

The thermal conductivity of the polymeric protrusions and base can each independently range from about 0.01 to 0.5 W/m-K or can be less than about 0.5 W/m-K, 0.4 W/m-K, 0.3 W/m-K, 0.2 W/m-K, or 0.1 W/m-K. The thermal conductivity of the heat sink can range from about 0.01 to 0.5 W/m-K or can be less than about 0.5 W/m-K, 0.4 W/m-K, 0.3 W/m-K, 0.2 W/m-K, or 0.1 W/m-K. In some cases, the polymeric protrusions and/or base are formed of a nylon which is thermally non-conductive or has low thermal conductivity, such as in the range of between about 0.2 to 0.28 W/m-K. In some cases, the polymeric protrusions and/or base are formed of a polycarbonate which is thermally non-conductive or has low thermal conductivity, such as in the range of between about 0.19 to 0.22 W/m-K. In some cases, the polymeric protrusions and/or base are formed of a polypropylene which is thermally non-conductive or has low thermal conductivity, such as in the range of between about 0.17 to 0.27 W/m-K. In some cases, the polymeric protrusions and/or base are formed of a polyurethane which is thermally non-conductive or has low thermal conductivity, such as in the range of between about 0.17 to 0.25 W/m-K. In some cases, the polymeric protrusions and/or base are formed of a styrene-ethylene-butylene-styrene which is thermally non-conductive or has low thermal conductivity, such as in the range of between about 0.17 to 0.28 W/m-K. When formed from as a single unit of the same material the polymeric protrusions and base have the same thermal conductivity. The polymer(s) used to form the protrusions and/or base may be entirely free or substantially free of any additives that increase thermal conductivity. "Substantially free," as used herein refers to less than 5%, 4%, 3%, 2%, 1%, 0.9%, 0.8%, 0.7%, 0.6%, 0.5%, 0.4%, 0.3%, 0.2%, or 0.1%, by weight of polymer to additive used to fabricate the polymeric protrusions and/or the base. In some cases, the heat sinks described are formed only of the low thermal conductivity polymers and do not comprise any metal or other thermal conductive material therein.

Figure 2A:
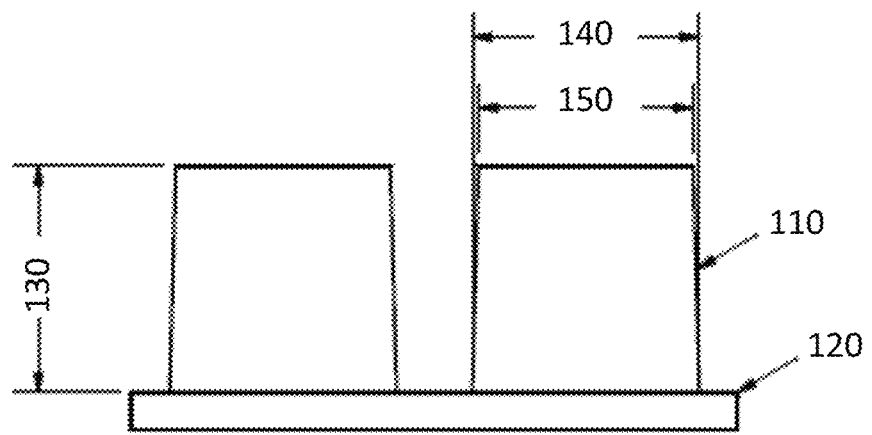
FIG. 2A shows a non-limiting cross-section view of a schematic of a heat sink wherein each of the polymeric protrusions 110 on the base 120 has a major dimension 130 (i.e., height) and a first minor dimension 140 (i.e., width). Polymeric protrusions 110 are optionally tapered and when tapered have a second minor dimension 150 which is less than the first minor dimension 140.

FIG. 2A shows a non-limiting cross-sectional view of a heat sink shows that each polymeric protrusion 110 on base 120 can independently have a major dimension 130 (i.e., height) and a first minor dimension 140 (i.e., diameter). FIG. 2A also shows that each of the polymeric protrusion 110 can be optionally tapered, where the taper is defined by a second minor dimension 150 which is less than the first minor dimension 140. Tapering facilitates removal from a mold used in their manufacture.

In some instances, all the polymeric protrusions on a heat sink have identical major dimensions, first minor dimensions, and second minor dimensions (if tapered) and are thus uniform in size on the heat sink. In some other instances, the polymeric protrusions on a heat sink can have different major dimensions, first minor dimensions, and second minor dimensions (if tapered) and are thus not uniform in size across the heat sink.

In some instances, all the polymeric protrusions on a heat sink have identical major dimensions, first minor dimensions, and second minor dimensions (if tapered) and are thus uniform in size on the heat sink. In some other instances, the polymeric protrusions on a heat sink can have different major dimensions, first minor dimensions, and second minor dimensions (if tapered) and are thus not uniform in size across the heat sink.

The polymeric protrusions may be arranged in a regular or an irregular array on the base. The polymeric protrusions may each be independently vertical or substantially vertical posts, cones, or extended rows or rails, or combinations thereof (wherein substantially vertical means at least about 80°, 81°, 82°, 83°, 84°, 85°, 86°, 87°, 88°, or 89° normal to the base. The polymeric protrusions can have straight and/or curved sidewalls resulting in rectangular, triangular, trapezoidal, hemispherical, or other profiles. The shapes of the polymeric protrusions present on a heat sink may be the uniform or non-uniform. In another instance, any desired three-dimensional shape can be used for the polymeric protrusions, such as cylinder, cone, truncated cone, pyramid, truncated pyramid, hemisphere, truncated hemisphere, rectangle, square, hexagon, octagon, other polygonal shape, additional suitable shapes, and combinations of the aforementioned shapes resulting in hybrid shapes. One or more shapes can be present in the plurality of polymeric protrusions of the heat sink.

In some instances, shape selection for the polymeric protrusions can be made to modify or control certain parameters including, but not limited to, surface area, airflow around the shape(s), flexibility, and conductivity, etc. The polymeric protrusions may terminate in any shape, such as being flat, round, wave, or an irregular shape. The polymeric protrusions may have the same (uniform), similar, or different heights. The sides of the polymeric protrusions can have any shape compatible with the protrusion shape such as flat, convex, concave, or irregular shape. The top portion of each of the polymeric protrusions can be of any desired shape, such as a mushroom, a point, a bulb, airfoil, independently with a convex or concave surface in addition to its overall shape, and the top portion may be symmetrical or asymmetrical.

The polymeric protrusions can assist and/or direct the flow of a cooling medium (such as air, water, or other cooling fluid) to increase the heat transfer efficiency of the heat sink. The polymeric protrusions can be selected to afford higher overall flow of the cooling medium to improve overall heat transfer and heat sink performance. In some instances, the polymeric protrusions can include additional features such as being fluted, dimpled, recessed, and/or ribbed. These features can be designed to modify cooling medium flow around the protrusions which can also increase the heat transfer surface area for a given polymeric protrusion type present in the heat sink.

The polymeric protrusions can be flexible or inflexible. Flexible means that the polymeric protrusions are capable of being deflected by at least about 50% of the thickness (at the thinnest region) of the polymeric protrusions away from a center line of the protrusions without breaking, cracking, or plastically deforming, when the deflection occurs at the thinnest area of the protrusion.

The major dimension (i.e., height) and first minor dimension (i.e., diameter) of each polymeric protrusion can each have a size in the range of between about 1 to 15 mm 1 to 10 mm, 1 to 9 mm, 1 to 8 mm, 1 to 7 mm, 1 to 6 mm, 1 to 5 mm, 1 to 4 mm, 1 to 3 mm, or 1 to 2 nm. In some instances, the polymeric pins have both major and first minor dimensions which do not exceed 10 mm or are in the range of between about 1 to 10 mm in some other instances the major dimensions of the polymeric protrusions do not exceed 10 mm or are in the range of between about 1 to 10 mm. In some cases, the major dimension and first minor dimension of a polymeric protrusion is the same and in some cases they can differ. In instances where the polymeric protrusions are tapered, the second minor dimension has a size which is about 1 to 15% less than the first minor dimension or at least about 1%, 2%, 3%, 4%, 5%, 6%, 7%, 8%, 9%, or 10% less than the first minor dimension. In some cases, the major dimension and first minor dimension of the polymeric protrusions are uniformly about 7 mm by 7 mm, 6 mm by 6 mm, 5 mm by 5 mm, 4 mm by 4 mm, 3 mm by 3 mm, 2 mm by 2 mm, or 1 mm by 1 mm, respectively. In certain other cases, the major dimension and first minor dimension of the polymeric protrusions are uniformly 3 mm by 2 mm or 2 mm by 3 mm, respectively.

In some instances, the major dimension of all the polymeric protrusions is between about 1 to 3 mm, such that there is a low profile of the polymeric protrusions. In some instances, the first minor dimension is selected to be less than the first major dimension. In yet some other instances, the first minor dimension is selected to be greater than the first major dimension.

The base, as shown for example in FIG. 2A, can have thickness which is in the range of between about 0.1 to 3 mm, 0.1 to 2 mm, 0.1 to 1 mm, 0.5 to 1 mm. In some instances, the base thickness is at least about 0.1, 0.2, 0.3, 0.4, 0.5, 0.6, 0.7, 0.8, 0.9, 1, 1.5, 2, 2.5, or 3 mm. In some instances, the base thickness is less than about 2 mm. In some cases, the base thickness ranges between about 0.3 to 3 mm, 0.3 to 2 mm, 0.3 to 1 mm, 0.3 to 1 mm. In some other cases, the base thickness is chosen to be about 2, 3, 4, 5, 6, 7, 8, 9, 10, 11, 12, 13, 14, or 15 times less than the size of the major dimension (i.e., height) of the polymeric protrusions. In some instances, the ratio of base thickness to the major dimension (i.e., height) can be selected to be at least 1:4, at least 1:5, at least 1:6, at least 1:7, at least 1:8, at least 1:9, or at least 1:10. In still other cases, the base thickness is chosen to be about 3, 4, 5, 6, 7, 8, 9, 10, 11, 12, 13, 14, or 15 times less than the size of the first minor dimension (i.e., diameter) of the polymeric protrusions. In some other instances, the ratio of base thickness to first minor dimension (i.e., diameter) can be selected to be at least 1:4, at least 1:5, at least 1:6, at least 1:7, at least 1:8, at least 1:9, or at least 1:10. The base may have a uniform thickness or a non-uniform thickness. The thicknesses described above are also applicable if the base include any additional/optional layers thereon, such as the foil or tape described. It is believed that a thinner overall base thickness provides for more flexibility and helps to lower the profile of the heat sink permitting it to fit into small spaces.

Figure 2B:
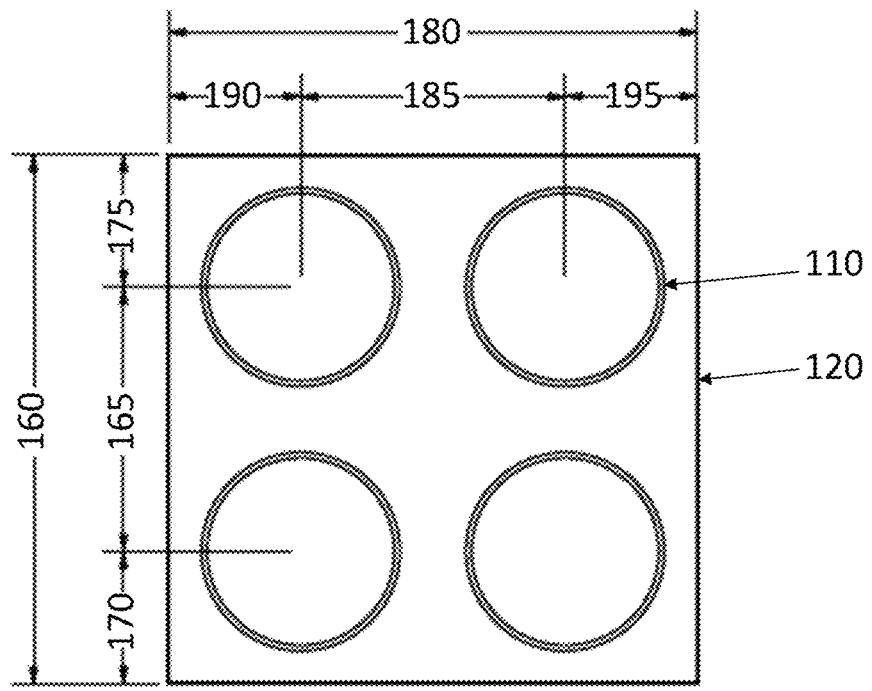
FIG. 2B shows a non-limiting top-down view of a schematic of a heat sink wherein the base 120 has first and second side dimensions 160 and 180 (i.e., length and width). Adjacent polymeric protrusions 110 can have center-to-center separation distances 165 and 185. Each polymeric protrusion can independently have a distance from the center to an edge of the base 170, 175, 190, and 195.

FIG. 2B shows a non-limiting top-down view of a heat sink wherein the base 120 has first and second side dimensions 160 and 180 (i.e., length, width). The first and second side dimensions of the base can each independently range in size between about 0.1 to 250 mm, 1 to 250 mm, 25 to 250 mm, 25 to 250 mm, 25 to 200 mm, 25 to 150 mm, 25 to 100 mm, or 25 to 50 mm. Adjacent polymeric protrusions 110 can have center-to-center separation distances 165 and 185.

The center-to-center separation distances between adjacent polymeric protrusions may range between about 2 to 15 mm, 3 to 15 mm, 5 to 10 mm or be at least about 3, 4, 5, 6, 7, 8, 9, or 10 mm. In some cases, the center-to-center is less than about half of the first minor dimension (i.e., diameter) of the polymeric protrusions. Each polymeric protrusion can independently have a distance from the center of a protrusion to an edge of the base 170, 175, 190, and 195. The distances from the center to an edge of the base can be any distance falling within the range of the size of the first and second side dimensions listed above.

Figure 2C:
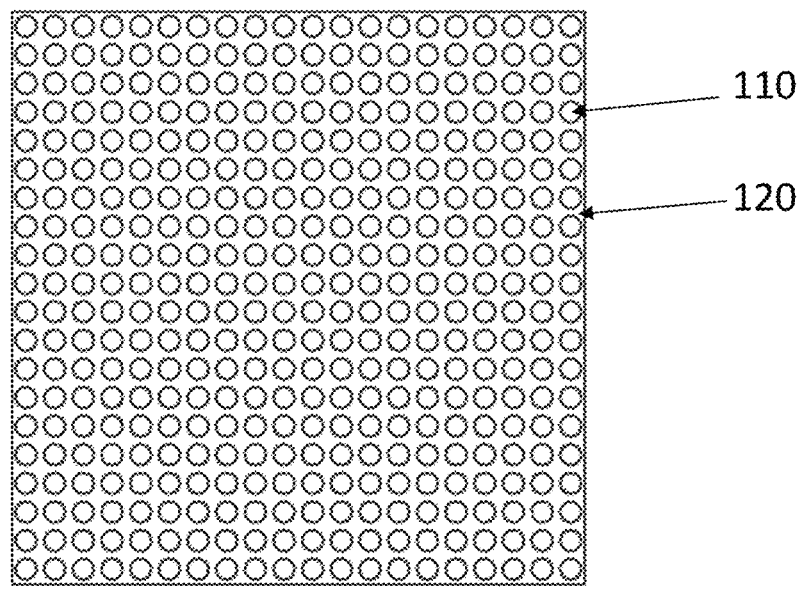
FIG. 2C shows a non-limiting top-down view of a schematic of a heat sink having an array of polymeric protrusions 110 which are aligned in rows and columns on a base 120.
Figure 2D:
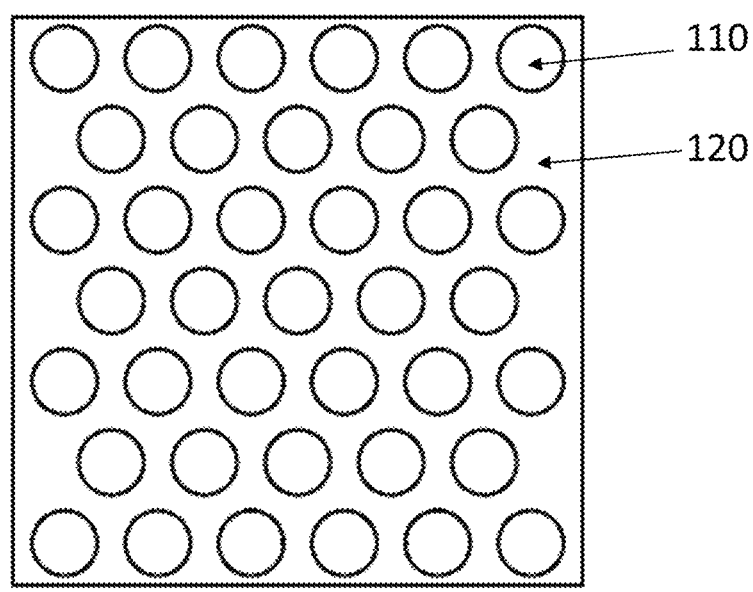
FIG. 2D shows a non-limiting top-down view of a schematic of a heat sink having an array of polymeric protrusions 110 on a base 120 where the polymeric protrusions are staggered or offset between rows and/or columns.

The polymeric protrusions can be arranged on the base in uniform or non-uniform distributions. In some uniform distributions, the polymeric protrusions form one or more rows and one or more columns and the polymeric protrusions are all aligned along the rows and/or columns (i.e., forming a grid pattern), as shown in non-limiting FIG. 2C. In some other distributions, the polymeric protrusions form one or more rows and columns and the polymeric protrusions are staggered or offset between the one or more rows and/or columns, as shown in non-limiting FIG. 2D. In some instances, staggered or offset polymeric protrusions means that each alternating row of polymeric protrusions is offset by about half the spacing between to adjacent polymeric protrusions The shape of the base of the heat sinks are typically square or rectangular, depending on the first and second side dimensions being different in size. Other shapes for the heat sink base are also encompassed beyond what is shown in the Figures. For example, the base may have a circular, oval, triangular, hexagonal or other polygonal shapes, diagonal, sinusoidal, rails/posts, and combinations thereof.

In some cases, the dimensions of the base of the heat sink are a function of the number of polymeric protrusions which are desired to be present on the base. Depending on the size of the polymeric protrusions and the spacing between them, the heat sink may have a suitable size to include a 2×2 up to 256×256 or 2×2 up to 160×160 array of polymeric protrusions on a given base.

Figure 3A:
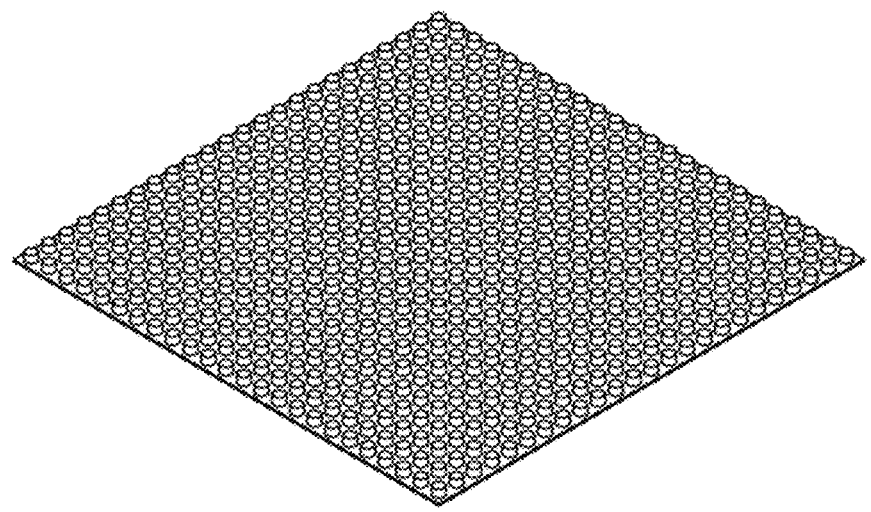
FIG. 3A shows a non-limiting illustration of a 120 mm by 120 mm low profile heat sink having tapered polymeric protrusions of 2 mm as the major dimension, 3 mm as the first minor dimension, 2.8 mm as the second minor dimension, a base thickness of 0.5 mm. The polymeric protrusions are aligned and uniformly spaced 5 mm apart from each other. The polymeric protrusions closest to the edges have a distance from their center to the closest edge of the base which is 2.5 mm.

As shown in FIG. 3A, in one case the heat sink is a 120 mm by 120 mm low profile heat sink having tapered polymeric protrusions of 2 mm as the major dimension, 3 mm as the first minor dimension, 2.8 mm as the second minor dimension, a base thickness of 0.5 mm. The polymeric protrusions are aligned and uniformly spaced 5 mm apart from each other. The polymeric protrusions closest to the edges have a distance from their center to the closest edge of the base which is 2.5 mm.

Figure 3B:
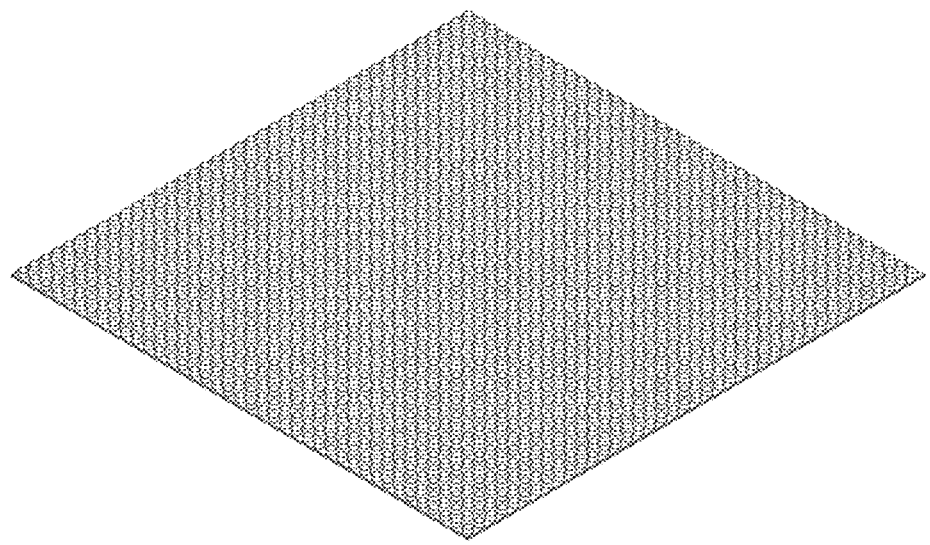
FIG. 3B shows a non-limiting illustration of a 120 mm by 120 mm low profile heat sink having tapered polymeric protrusions of 1 mm as the major dimension, 2 mm as the first minor dimension, 1.85 mm as the second minor dimension, a base thickness of 0.5 mm. The polymeric protrusions are aligned and uniformly spaced 3 mm apart from each other. The polymeric protrusions closest to the edges have a distance from their center to the closest edge of the base which is 1.5 mm.

As shown in FIG. 3B, in one case the heat sink is a 120 mm by 120 mm low profile heat sink having tapered polymeric protrusions of 1 mm as the major dimension, 2 mm as the first minor dimension, 1.85 mm as the second minor dimension, a base thickness of 0.5 mm. The polymeric protrusions are aligned and uniformly spaced 3 mm apart from each other. The polymeric protrusions closest to the edges have a distance from their center to the closest edge of the base which is 1.5 mm.

Figure 3C:
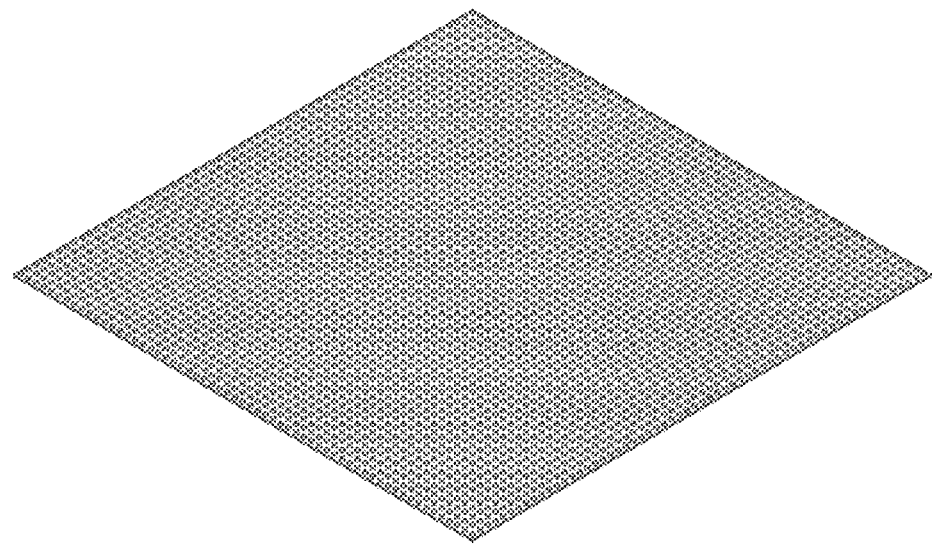
FIG. 3C shows a non-limiting illustration of a 120 mm by 120 mm low profile heat sink having tapered polymeric protrusions of 0.5 mm as the major dimension, 1 mm as the first minor dimension, 0.9 mm as the second minor dimension, a base thickness of 0.5 mm. The polymeric protrusions are aligned and uniformly spaced 2 mm apart from each other. The polymeric protrusions closest to the edges have a distance from their center to the closest edge of the base which is 1 mm.

As shown in FIG. 3C, in one case the heat sink is a 120 mm by 120 mm low profile heat sink having tapered polymeric protrusions of 0.5 mm as the major dimension, 1 mm as the first minor dimension, 0.9 mm as the second minor dimension, a base thickness of 0.5 mm. The polymeric protrusions are aligned and uniformly spaced 2 mm apart from each other. The polymeric protrusions closest to the edges have a distance from their center to the closest edge of the base which is 1 mm.

Figure 4:
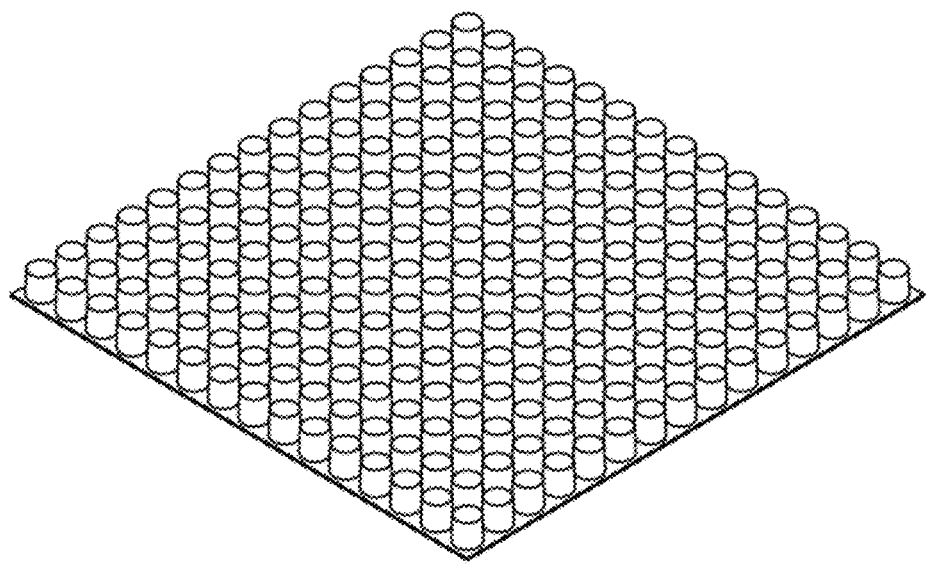
FIG. 4 shows a non-limiting illustration of a 120 mm by 120 mm a heat sink having tapered polymeric protrusions of 6 mm as the major dimension, 6 mm as the first minor dimension, 5.67 mm as the second minor dimension, a base thickness of 0.5 mm. The polymeric protrusions are aligned and uniformly spaced 8 mm apart from each other. The polymeric protrusions closest to the edges have a distance from their center to the closest edge of the base which is 4 mm.

As shown in FIG. 4, in one case the heat sink is a 120 mm by 120 mm a heat sink having tapered polymeric protrusions of 6 mm as the major dimension, 6 mm as the first minor dimension, 5.67 mm as the second minor dimension, a base thickness of 0.4 mm. The polymeric protrusions are aligned and uniformly spaced 8 mm apart from each other. The polymeric protrusions closest to the edges have a distance from their center to the closest edge of the base which is 4 mm.

Heat sinks having other dimensions than those shown in illustrative FIGS. 3A-3C and FIG. 4 are possible and the heat sinks may comprise additional components described, such as a foil or tape on the base, or other layers, thereon.

A. Optional Foil or Tape

In some instances the heat sinks can further include a foil or tape present below the base, as shown in FIG. 1B. The foil or tape is made of or contains a metal or graphite having a high thermal conductivity. The thermal conductivity of the foil or tape can range from about 5 to 1800 W/m-K, 5 to 700 W/m-K, 5 to 400 W/m-K, 5 to 200 W/m-K, 5 to 150 W/m-K, 5 to 100 W/m-K, 10 to 75 W/m-K, or 5 to 100 W/m-K; or the thermal conductivity can be at least about 10 W/m-K, 20 W/m-K, 30 W/m-K, 40 W/m-K, 50 W/m-K, 60 W/m-K, 70 W/m-K, 80 W/m-K, 100 W/m-K, or greater. In certain instances, the thermal conductivity is in a range of between about 150-237 W/m-k or between about 150-400 W/m-K. Metals can be selected from aluminum, copper, alloys thereof, or combinations thereof. The metallic or graphitic foils or tapes may be formed of more than one layer of the metals and/or graphite described.

The foil or tape typically covers all or substantially all of the bottom surface of the base opposite the surface including the polymeric protrusions. "Substantially all," as used herein refers to covering at least 80%, 85%, 90%, 95%, 96%, 98%, 99%, 99.5%, or 99.9% of the surface area of the bottom of the base. The foil or tape should preferably cover at least 50% of the base to maximize the effectiveness of the heat sink. In some instances, the foil or tape may be larger than the bottom surface of the base opposite the surface including the polymeric protrusions. For example, the foil or tape may have an area which is about 10%, 20%, 30%, 40%, 50%, 60%, 70%, 80%, 90%, 100%, or even larger, if necessary, than the area of bottom surface of the base opposite the surface including the polymeric protrusions.

In some other instances, the optional foil or tape on the base of the heat sink, as shown in FIG. 1B, can be made of a dielectric polymer film with aligned crystal structure that has in-plane thermal conductivity greater than 10 W/m-K, such as aligned high molecular weight polyethylene films. In still some other instances this polymer film with aligned crystal structure can be inside the base and surrounded by low thermal conductivity polymer, such as those described herein.

The foil or tape present on the base can be free or substantially free carbon nanotubes in some instances wherein in "substantially free" means less than 5%, 4%, 3%, 2%, 1%, 0.9%, 0.8%, 0.7%, 0.6%, 0.5%, 0.4%, 0.3%, 0.2%, 0.1%, or less.

In still some other instances, the foil or tape present on the base can include carbon nanotubes therein as described further below.

In some instances, the size of the foil or tape is the same size as the base. The foil or tape can have first and second side dimensions each independently ranging in size between about 5 to 250 mm, 10 to 250 mm, 25 to 250 mm, 25 to 250 mm, 25 to 200 mm, 25 to 150 mm, 25 to 100 mm, or 25 to 50 mm. The thickness of the foil or tape is selected to be thinner than that of the thickness of the polymeric base. In some instances, the thickness is about 10%, 20%, 30%, 40%, 50%, 60%, 70%, 80%, or 90% of the thickness of the base, as described above. In some other instances, the thickness of the foil or tape is about 1 mm or less, 0.9 mm or less, 0.8 mm or less, 0.7 mm or less, 0.6 mm or less, 0.5 mm or less, 0.4 mm or less, 0.3 mm or less, or 0.2 mm or less. In certain instances, the foil or tape has a thickness in the range of between about 0.05-0.250 mm.

The thermal resistance between the foil or tape and the base, or the entirety of the heat sink, can be less than about 3 cm$^2$ K/W, 2 cm$^2$ K/W, 1 cm$^2$ K/W, 0.9 cm$^2$ K/W, 0.8 cm$^2$ K/W, 0.7 cm$^2$ K/W, 0.6 cm$^2$ K/W, 0.5 cm$^2$ K/W, 0.4 cm$^2$ K/W, 0.3 cm$^2$ K/W, 0.2 cm$^2$ K/W, or 0.1 cm$^2$ K/W. In certain instances, the thermal resistance is between about 0.2-0.7 cm$^2$ K/W.

The heat sinks, with or without a foil or tape present, described herein have increased surface area as compared to a heat sink without polymeric protrusions present. The surface area can be enhanced/increased by about 1-10 times, as compared to a heat sink without polymeric protrusions thereon. In some cases, the surface area is enhanced/increased by at least about 1, 1.25, 1.5, 1.75, 2, 2.25, 2.5, 2.75, 3, 3.25, 3.5, 3.75, 4, 4.25, 4.5, 4.75, 5, 5.25, 5.5, 5.75, 6, 6.25, 6.5, 6.75, 7, 7.25, 7.5, 7.75, 8, 8.25, 8.5, 8.75, 9, 9.25, 9.5, 9.75, 10 times, or greater, as compared to a heat sink not having polymeric protrusions thereon. In certain particular instances, the surface area is increased by at least 8 to 10 times. In other particular instances, the surface area is increased by at least 1.5 to 3 times. For the heat sinks described, a parameter P can be defined as the surface area enhancement value (E) divided by the height of the polymeric protrusions (if all the same height) or the average height of the polymeric protrusions (if the heights differ). For example, if the surface area is enhanced/increased by 2.75 times and the height of the polymeric protrusions is 6 mm then P=(2.75)/6 mm=0.46 E/mm. In another example, if the surface area is enhanced/increased by 1.75 times and the height of the polymeric protrusions is 2 mm then P=(1.75)/2 mm=0.875 E/mm. In yet another example, if the surface area is enhanced/increased by 1.5 times and the height of the polymeric protrusions is 1 mm then P=(1.75)/2 mm=1.5 E/mm. The height (i.e., major dimension) of the polymeric protrusions can take any value described above. Accordingly, the heat sinks may have a P value, as defined above, which is in the range of between about 0.05-2 E/mm, 0.1-1.75 E/mm, 0.1-1.5 E/mm. In some cases, the heat sinks may have a P value, as defined above, which is at least about 0.05, 0.1, 0.5, 1, 1.25, 1.5 E/mm, or greater.

The heat sinks, with or without a foil or tape present, described herein can reduce steady state delta T (temperature difference) between surface(s) on which the heat sink is disposed on and the ambient by at least a factor of about 3, 2.75, 2.5, 2.25, 2, 1.75, 1.5, or 1.25 times. The presence of forced convection around the heat sink can further reduce the delta T value. For the heat sinks, managing a hot spot(s) in a device (i.e., an electronic device) if the delta T is 10 degrees in temperature between ambient and the device hot spot(s) the heat sink contacting the device at the location of the hot spot(s) can reduce temperature by about 3-6 degrees in temperature, with larger reductions in temperature if delta is greater than 10 degrees. For the heat sinks, according to the heat transfer equation $Q=A \times h \times (T_2-T_1)$, where "A" is surface area where the heat transfer takes place in m$^2$; "$T_2$" is the temperature of the surrounding (ambient) and "$T_1$" is the temperature of a heat source or heat producing device; and "h" is the heat transfer coefficient (h=q/ΔT; where q is the heat flux in W/m² and ΔT is the difference in temperature between a surface and surrounding area in Kelvin) the value of Q may be low per area at the heat sink interface with the device. An example of an appropriate power for a 2"×2" heat sink would less than about 10 W when subjected to natural convection to maintain device temperatures below 40 degrees Celsius above the ambient temperature.

The heat sinks, with or without a foil or tape present below the base, are conformable and flexible. The heat sinks can be curved around a surface of a device, such as of a heat generating device. The heat sink can conform to a device's dimensions or components thereof, and can deform or deflect under an installation force. The heat sinks can conform to flat, non-flat, undulating, or other uniform or non-uniform surface shapes (except for the roughness of the surface and heat sink) and provide a good thermal interface in spite of the heat-generating device surface lack of uniformity. In some instances, the heat sinks are flexible and can conform, deform, and/or deflect under a compressive force in order to contact all of the surface(s) of a heat source or heat generating device (such as those discussed in the applications section) which is to be contacted with the heat sink or substantially all of the surface (i.e., at least about 90%, 91%, 92%, 93%, 94%, 95%, 96%, 97%, 98%, or 99%, or higher). In some instances, the heat sink can conform to contact multiple devices or components within the same substrate or system.

The heat sinks, with or without a foil or tape, can conform, flex, and/or curve to contact all of the desired surface of a heat generating device (except for the roughness of the surface and heat sink) which is to be contacted with the heat sink or substantially all of the surface desired and traps no or a minimum amount of air or voids and provides contact between the surface interfaces contacted by the heat sink's base layer. "Substantially all," as used herein refers to covering at least 95%, 96%, 98%, 99%, 99.5%, or 99.9% of the surface area of the device. Air in the interface between the heat sink and the device can increase thermal impedance. The flexible and conformable heat sink conforms to the heat-generating surface and minimizes gaps. The flexibility and surface conforming features of the heat sinks allow for the exclusion of components, such as pads, epoxies, greases, pastes, etc.) between the heat sink base and a heat-generating surface(s) of a device. Flexibility and conformability allow for the heat sink to be flattened or smoothed, as needed, to mate well or completely to the surface(s) of a heat-generating device.

The heat sinks allow for a bending to a radius of less than about 30 cm, less than about 10 cm, less than about 5 cm, or even lower) at room temperature without significantly adversely affecting the function or efficiency of the heat sink. That is, the heat sink does not crack, kink, or significantly plastically deform to a shape that may leave a gap between the heat sink and a heat-generating device or substrate thereof, whereas traditional metal heat sinks will require an impractical amount of force to curve to the same dimensions. The heat sink preferably has a low level of elastic recovery force such that the heat sink does not "spring back" once applied.

The flexibility of the polymeric protrusions and the base of the flexible and conformable heat sink allow bending or flexing, deflecting, and/or absorbing forces (e.g., impact force, shock force, vibration force with variable energy and duration). In some instances, the heat sink can act as a vibration damper or shock isolator to the heat generating device to which it is attached.

In certain instances where the bending radius of a heat sink is greater than the radius of the heat source or heat generating device to be contacted, the heat sink may be used in conjunction with a gap filling pad or material that makes up for the difference between the two different radii. The heat sink can also allow for a bending to a radius of less than about 30 cm, less than about 10 cm, or less than about 5 cm, or even less, at room temperature without adversely affecting the function or efficiency of the heat sink.

In certain instances, the heat sink is also reformable. A reformable heat sink can be heated and reformed into a new shape with a platen or die that is shaped to conform the heat sink to the heat-source device or substrate, such as a chip or other heat generating device. The heat sink article is reformable and can be customized to any desired shape. For example, computer chips can have bowed, uneven, or less than perfectly planar surfaces which are easily accommodated via reforming the base and/or layers thereof of the heat sink. Reforming is useful for heat-generating devices with large degrees of non-flatness or curvature.

In some instances, the heat sinks or components thereof can absorb, reduce, or shield interference at electromagnetic and/or radio frequencies (EMI/RFI).

In certain instances, the heat sinks, with or without a foil or tape, exhibit thermal resistances of less than about 500, 250, 125, 50 or 25 cm² K/W. In certain cases, the heat sinks exhibit thermal resistances of less than 500 cm² K/W.

The Young's modulus of the polymeric protrusions when measured at 70° F. is typically less than 1,000,000 psi, less than 40,000 psi, or less than 15,000 psi. For comparison, the modulus of aluminum is approximately 10,000,000 psi.

1. Optional Foil or Tape including Carbon Nanotubes

The foil or tape can be formed of or can include a thermal interface material (TIM) comprising carbon nanotubes, as described below.

The TIMs forming or present in the foil or tape are formed from carbon nanotube arrays or carbon nanotube sheets supported on, or attached to, the surface of an inert substrate/support, as described below. In some embodiments, the TIMs are formed of a single-tiered or single layered carbon nanotube array or carbon nanotube sheet. In certain other embodiments, the carbon nanotube arrays or sheets described below can be stacked according to the methods to afford multilayered or multitiered structures, as described in further detail below.

a. Carbon nanotube arrays

Carbon nanotube arrays contain a plurality of carbon nanotubes supported on, or attached to, the surface of an inert substrate/support, such as a metallic (e.g., Al or Au) foil, metal alloys (i.e., steel). In some embodiments, the substrate/support can be a flexible, electrically, and thermally conductive substrate, such as graphite or other carbon-based material. In yet other embodiments, the substrate/support can be an electrically insulating substrate such as a flexible ceramic. The CNT arrays can be formed using the methods described below. The CNTs are vertically aligned on the substrate/support. CNTs are said to be "vertically aligned" when they are substantially perpendicular to the surface on which they are supported or attached. Nanotubes are said to be substantially perpendicular when they are oriented on average within 30, 25, 20, 15, 10, or 5 degrees of the surface normal.

Generally, the nanotubes are present at a sufficient density such that the nanotubes are self-supporting and adopt a substantially perpendicular orientation to the surface of the substrate/support. In some cases, the carbon nanotube density on the substrate/support surface ranges from about $1 \times 10^7$ to $1 \times 10^{11}$ nanotubes per mm$^2$, more preferably from about $1 \times 10^8$ to $1 \times 10^{10}$ nanotubes per mm$^2$, most preferably from about $1 \times 10^9$ to $1 \times 10^{10}$ nanotubes per mm$^2$. Preferably, the nanotubes are spaced at optimal distances from one another and are of uniform height to minimize thermal transfer losses, thereby maximizing their collective thermal diffusivity.

The CNT arrays contain nanotubes which are continuous from the top of the array (i.e., the surface formed by the distal end of the carbon nanotubes when vertically aligned on the multilayer substrate) to bottom of the array (i.e., the surface of the multilayer substrate). The array may be formed from multi-wall carbon nanotubes (MWNTs), which generally refers to nanotubes having between approximately 4 and approximately 10 walls. The array may also be formed from few-wall nanotubes (FWNTs), which generally refer to nanotubes containing approximately 1-3 walls. FWNTs include single-wall carbon nanotubes (SWNTs), double-wall carbon nanotubes (DWNTS), and triple-wall carbon nanotubes (TWNTs). In certain embodiments, the nanotubes are MWNTs. In some embodiments, the diameter of MWNTs in the arrays ranges from 10 to 40 nm, more preferably 15 to 30 nm, most preferably about 20 nm. The length of CNTs in the arrays can range from 1 to 5,000 micrometers, preferably 5 to 5000 micrometers, preferably 5 to 2500 micrometers, more preferably 5 to 2000 micrometers, more preferably 5 to 1000 micrometers. In some embodiments, the length of CNTs in the arrays can range from 1-500 micrometers, even more preferably 1-100 micrometers.

The CNTs display strong adhesion to the substrate/support. In certain embodiments, the CNT array or sheet will remain substantially intact after being immersed in a solvent, such as ethanol, and sonicated for a period of at least five minutes. In particular embodiments, at least about 90%, 95%, 96%, 97%, 98%, 99%, or 99.9% of the CNTs remain on the surface after sonication in ethanol.

b. Carbon Nanotube Sheets

Carbon nanotube sheets are also described herein. The sheets contain a plurality of carbon nanotubes that support each other through strong van der Waals force interactions and mechanical entanglement to form a freestanding material. The CNT sheets can be formed using the methods described below. The CNTs form a freestanding sheet and are aligned in plane with the surface of the sheet. CNTs are said to be "aligned in plane" when they are substantially parallel to the surface of the sheet that they form. Nanotubes are said to be substantially parallel when they are oriented on average greater than 40, 50, 60, 70, 80, or 85 degrees from sheet surface normal.

Generally, the nanotubes are present at a sufficient density such that the nanotubes are self-supporting and adopt a substantially parallel orientation to the surface of the sheet. In some cases, the carbon nanotube density on the substrate/support surface ranges from about $1 \times 10^7$ to $1 \times 10^{11}$ nanotubes per mm$^2$, more preferably from about $1 \times 10^8$ to $1 \times 10^{10}$ nanotubes per mm$^2$, most preferably from about $1 \times 10^9$ to $1 \times 10^{10}$ nanotubes per mm$^2$. Preferably, the nanotubes are spaced at optimal distances from one another and are of uniform length to minimize thermal transfer losses, thereby maximizing their collective thermal diffusivity.

The CNT sheets may be formed from multi-wall carbon nanotubes (MWNTs), which generally refers to nanotubes having between approximately 4 and approximately 10 walls. The sheets may also be formed from few-wall nanotubes (FWNTs), which generally refers to nanotubes containing approximately 1-3 walls. FWNTs include single-wall carbon nanotubes (SWNTs), double-wall carbon nanotubes (DWNTS), and triple-wall carbon nanotubes (TWNTs). In certain embodiments, the nanotubes are MWNTs. In some embodiments, the diameter of MWNTs in the arrays ranges from 10 to 40 nm, more preferably 15 to 30 nm, most preferably about 20 nm. The length of CNTs in the sheets can range from 1 to 5,000 micrometers, preferably 100 to 5000 micrometers, preferably 500 to 5000 micrometers, more preferably 1000 to 5000 micrometers. In some embodiments, the length of CNTs in the sheets can range from 1-500 micrometers, even more preferably 1-100 micrometers.

2. Coating(s)/Coating Materials

The CNT array or sheet can include a coating or coating material (terms can be used interchangeably) which adheres or is bonded to the CNTs. The coating/coating material can be applied as described below. In some embodiments, the coating contains one or more oligomeric materials, polymeric materials, waxes, or combinations thereof. In other embodiments, the coating contains one or more non-polymeric materials. In some embodiments, the coating can contain a mixture of oligomeric, waxes, and/or polymeric material and non-polymeric materials.

In certain embodiments, the coating material(s) act as a bonding agent(s) which can bonded, such as chemically, the carbon nanotubes of the stacked arrays or sheets. Without limitation, such coating material(s) which can act as bonding agents(s) can be selected from adhesives (i.e., acrylate adhesives) and a phase change material (i.e., a wax or waxes).

In some embodiments, the coating which adheres or is bonded to the CNTs of an array is applied before two or more CNT arrays or sheets are stacked while in other embodiments, the coating which adheres or is bonded to the CNTs of an array is applied following stacking of two or more CNT arrays or sheets. In yet other embodiments, the coating is infiltrated or backfilled into multilayered or multitiered structures formed of stacked CNT arrays or sheets and adheres or is bonded to the CNTs of the arrays forming the structure. As used herein, "infiltration" or "infiltrated" refer to a coating material(s) which are permeated through at least some of the carbon nanotubes of the arrays or sheets which were stacked to form the multilayered or multitiered structures. In some embodiments, the extent of infiltration is in the range of 0.1-99.9%. In some embodiments, the infiltrated coating material at least partially fills the interstitial space between carbon nanotubes while in some other embodiments the infiltrated coating coats at least some of the surfaces of the carbon nanotubes, or both. In some embodiments, the infiltrated coating material fills the all or substantially all (i.e., at least about 95%, 96%, 97%, 98%, or 99%) of the interstitial space between carbon nanotubes present in the tiers or layers of the structure formed by stacking of the CNT arrays or sheets.

A variety of materials can be coated onto the CNT arrays or sheets, prior to stacking, during stacking, or following stacking. In certain instances, the coatings can cause a decrease in the thermal resistance of the CNTs of arrays or sheets of structure having a plurality of layers or tiers, as defined herein. The coatings can be applied conformally to coat the tips and/or sidewalls of the CNTs. It is also desirable that the coating be reflowable as the interface is assembled using, for example, solvent, heat or some other easy to apply source. Polymers used as coatings are selected to be thermally stable up to at least 130° C. In some embodiments, the coating is readily removable, such as by heat or dissolution in a solvent, to allow for "reworking" of the interface.

"Reworking", as used herein, refers to breaking the interface (i.e., removing the coating) by applying solvent or heat.

a. Polymeric Coating Materials

In some embodiments, the coating is, or contains, one or more polymeric materials. The polymer coating can contain a conjugated polymer, such as an aromatic, heteroaromatic, or non-aromatic polymer, or a non-conjugated polymer.

Suitable classes of conjugated polymers include polyaromatic and polyheteroaromatics including, but not limited to, polythiophenes (including alkyl-substituted polythiophenes), polystyrenes, polypyrroles, polyacetylenes, polyanilines, polyfluorenes, polyphenylenes, polypyrenes, polyazulenes, polynaphthalenes, polycarbazoles, polyindoles, polyazepines, poly(3,4-ethylenedioxythiophenes), poly(p-phenyl sulfides), and poly(p-phenylene vinylene). Suitable non-aromatic, conjugated polymers include, but are not limited to, polyacetylenes and polydiacetylenes. The polymer classes listed above include substituted polymers, wherein the polymer backbone is substituted with one or more functional groups, such as alkyl groups. In some embodiments, the polymer is polystyrene (PS). In other embodiments, the polymer is poly(3-hexythiophene) (P3HT). In other embodiments, the polymer is poly(3,4-3thylenedioxythiophene) (PEDOT) or poly(3,4-3thylenedioxythiophene) poly(styrenesulfonate) (PEDOT:PSS).

In other embodiments, the polymer is a non-conjugated polymer. Suitable non-conjugated include, but are not limited to, polyvinyl alcohols (PVA), poly(methyl methacrylates) (PMMA), polydimethylsiloxanes (PDMS), polyurethane, silicones, acrylics, and combinations (blends) thereof.

In other embodiments, the polymer is a paraffin wax. In other embodiments, the polymer is a synthetic wax such as Fischer-Tropsch waxes or polyethylene waxes. In other embodiments, the polymer is a wax that has a melting temperature above 80, 90, 100, 110, or 120° C., preferably above 130° C.

In other embodiments, the polymer is an adhesive, such as, but not limited to, a hot glue or hot melt adhesive that combines wax, tackifiers and a polymer base to provide improved adhesion properties to one or more surfaces. In some embodiments, the adhesive is a pressure sensitive adhesive. In still other instances, the adhesive layer can include a double-sided pressure sensitive adhesive tape less than 0.5 mm in thickness. In certain other embodiments, the adhesive is a monomer that polymerizes upon contact with air or water such as a cyanoacrylate. In yet other embodiments, the adhesive is a combination of a pressure sensitive adhesive and a thermally activated (or activatable) adhesive polymers which enhances ease of adhesion of a multilayered or multitiered structure described herein which includes such a combination of coatings to a surface(s), by way of the pressure sensitive adhesive and additional and more permanent or semi-permanent adhesion by way of the thermal adhesive. In yet some other embodiments, the adhesive includes a thermoset adhesive or a heat cure epoxy.

3. Other Coating Materials a. Metallic Nanoparticles

The CNT arrays or sheets can additionally be coated with one or more metal nanoparticles. One or more metal nanoparticles may be adsorbed to the distal ends and/or sidewalls of the CNTs to bond the distal ends and/or sidewalls of the CNTs to a surface, reduce thermal resistance between the CNT array or sheet and a surface, or combinations thereof. Metal nanoparticles can be applied to CNT arrays or sheets using a variety of methods known in the art.

Examples of suitable metal nanoparticles include palladium, gold, silver, titanium, iron, nickel, copper, and combinations thereof.

b. Flowable or Phase Change Materials

In certain embodiments, flowable or phase change materials are applied to the CNT arrays or sheets prior to stacking, during stacking, or following stacking. Flowable or phase change materials may be added to the CNT array or sheet to displace the air between CNTs and improve contact between the distal ends and/or sidewalls of CNTs and a surface, and as a result reduce thermal resistance of the array or sheet and the contact between the array or sheet and a surface, or combinations thereof. Flowable or phase change materials can be applied to CNT arrays using a variety of methods known in the art.

Examples of suitable flowable or phase change materials include paraffin waxes, polyethylene waxes, hydrocarbon-based waxes in general, and blends thereof. Other examples of suitable flowable or phase change materials that are neither wax nor polymeric include liquid metals, oils, organic-inorganic and inorganic-inorganic eutectics, and blends thereof. In some embodiments, the coating material, such as a non-polymeric coating material and the flowable or phase change material are the same material or materials.

4. Multilayered or Multitiered Carbon Nanotube Structures

The CNT arrays or sheets described herein can be stacked according to the methods described below to afford multilayered or multitiered structures. In one instance, a non-limiting example is a structure formed by contacting/stacking the carbon nanotubes of two CNT arrays or sheets, which interdigitate at least partially, and which may optionally be coated with a suitable coating material as described herein.

In some embodiments the multilayered or multitiered structures can further include a coating, a coating of metallic nanoparticles, and/or a coating of flowable or phase change materials on the nanostructure elements, such as CNTs, of the arrays.

At least two CNT arrays or sheets can be stacked to form the multilayered or multitiered structures. By using more CNT arrays the thickness of the multilayered or multitiered structures can be increased as needed. In some embodiments, up to 5, 10, 15, 20, 25, 30, or more CNT arrays or sheets can be stacked according to the method described above. In some embodiments, multilayered or multitiered structures can include three, four, five, six, or seven layers or tiers as part of the multilayered or multitiered structure. The thickness of the resulting multilayered or multitiered structures formed by stacking can be in the range 1-10,000 microns or more. In some embodiments, the thickness of the resulting multilayered or multitiered structures formed by stacking can be 1-3,000 micrometers, even more preferably 70-3,000 micrometers. In some embodiments, the number of layers and/or thickness is based on the thickness of the CNT forest formed on the arrays used in the stacking process.

In a non-limiting embodiment, at least two vertically aligned arrays or sheets each formed on a support/substrate are stacked/contacted such that the nanostructure elements, such as CNTs, of the arrays at least partially interdigitate on contact. In one embodiment full interdigitation of nanostructure elements of the arrays occurs within one another when stacked. In other embodiments the arrays may interdigitate only at the tips of the nanostructure elements, such as CNTs. In yet other embodiments, the individual nanostructures can navigate through the nanostructures of the adjacent array during the interdigitating process and the nanostructure elements of the individual arrays, such as the CNTs or some portion thereof, fully or substantially interdigitate within one another; "substantially," as used herein, refers to at least 95%, 96%, 97%, 98%, or 99% interdigitation between the nanostructure elements of the individual arrays. In some embodiments, the extent of interdigitation is in the range of about 0.1% to 99% or at least about 1%, 5%, 10%, 20%, 30%, 40%, 50%, 60%, 70%, 80%, 90%, or 95%.

In some embodiments the nanostructures of the stacked arrays, which interdigitate at least partially, may also form into larger superstructures, such as, but not limited to, tube bundles, clumps, or rows. These superstructures may be formed through mechanisms such as capillary clumping or by way of application of a polymer coating prior to, during, or following the stacking process.

In some embodiments, a polymer coating and/or adhesive, or other coating as described above, is applied to the CNT array(s) which are subsequently stacked. In such embodiments, the thickness of the coating and/or adhesive, or other coating as described above, is about 1-1000 nm, more preferable 1-500 nm, and most preferably 1-100 nm.

In addition to the above, the favorable deformation mechanics of CNTs present in the multilayered or multitiered structures allow them to efficiently conform to the asperities of adjoining surfaces, resulting in high contact areas at the interfaces.

5. Properties of Thermal Interface Materials a. Reduction in Thermal Resistance

The CNT arrays or sheets described exhibit reduced thermal resistance. The thermal resistance can be measured using a variety of techniques known in the art, such as the photoacoustic (PA) method.

In one embodiment, the thermal resistance of the CNT arrays or sheets and the multilayered or multitiered structures formed by stacking of such CNT arrays or sheets is reduced by at least about 25%, 30%, 35%, 40%, 45%, 50%, 55%, 60%, 65%, 70% or greater compared to single tiered structures when measured, for example, using the photoacoustic method. In certain embodiments, the CNT arrays or sheets and the multilayered or multitiered structures formed by stacking of such CNT arrays or sheets exhibit thermal resistances of less than about 2.0, 1.0, 0.9, 0.8, 0.7, 0.6, 0.5, 0.4, 0.3, 0.2, or 0.1 cm$^2$ K/W. In such embodiments, the thermal resistance is about 1.0, preferably about 0.7 cm$^2$ K/W. In certain embodiments, the CNT arrays or sheets and the multilayered or multitiered structures formed by stacking of such CNT arrays or sheets exhibit thermal resistances of between about 2 and 0.1 cm$^2$ K/W. In such embodiments, the thermal resistance is about 2, 1, 0.9, 0.8, 0.7, 0.6, 0.5, 0.4, 0.3, 0.2, or 0.1 cm$^2$ K/W. In some embodiments, the thermal resistance value of a multilayered or multitiered structures formed by stacking of CNT arrays or sheets is the same or substantially unchanged as compared to the value(s) of the single layer arrays used to form the stack; "substantially," as used herein refers to less than a 10%, 5%, 4%, 3%, 2%, or 1% change.

In some instances, the multilayered or multitiered structures formed by stacking of CNT arrays or sheets, when used, for example, as thermal interface materials (TIMs) exhibit thermal resistance hysteresis and stable operation over a wide pressure range of 0 to 500 psi, 0 to 400 psi, 0 to 300 psi, 0 to 200 psi, or 0 to 100 psi, when increasing and decreasing the pressure on the TIM in the aforementioned ranges.

In one embodiment, the apparent thermal conductivity of the CNT arrays or sheets and the multilayered or multitiered structures formed by stacking of such CNT arrays or sheets is increased by at least about 25%, 30%, 35%, 40%, 45%, 50%, 55%, 60%, 65%, 70% or greater compared to single tiered structures. In some embodiments, the CNT arrays or sheets and the multilayered or multitiered structures formed by stacking of such CNT arrays or sheets exhibit conductance values in the range of about 1-2500 W/m-K, 1-2000 W/m-K, 1-1500 W/m-K, 1-1000 W/m-K, 1-500 W/m-K, 5-500 W/m-K, 5-400 W/m-K, 5-300 W/m-K, 5-200 W/m-K, 5-150 W/m-K, 5-100 W/m·K, or 3-30 W/m-K.

A coating may be optionally applied to the CNT arrays or sheets prior to, during, or following stacking to form multilayered or multitiered structures formed by stacking of such CNT arrays or sheets. Coating(s) were shown to be an effective means for increasing the contact area and reducing the thermal resistance of CNT forest thermal interfaces. The bonding process added by inclusion of nanoscale coatings around individual CNT contacts includes, for example, pulling, through capillary action, of additional CNTs close to the interface to increase contact area.

The multilayered or multitiered structures, demonstrate good compliance, i.e., the ability to conform when contacted to one or more surfaces of material(s) (such as a die or chip). Compliant multilayered or multitiered TIMs have contact areas at interfaces between surface(s) of material(s) and the TIM, such that the compliance (ability to conform) of the multilayered or multitiered TIMs, expressed as a percentage value, is between about 1% to 50%, 1% to 40%, 1% to 30%, 1% to 25%, 1% to 20%, or 1% to 10% of the total thickness of the TIM.

The multilayered or multitiered structures also demonstrate excellent elastic recovery properties following one or more repeated deformations, typically compressions, at varying pressures up to about 50, 100, 200, 300, 400, 500 psi, or greater. Elastic recovery of the multilayered or multitiered structures, expressed as a percentage value, following one or more compressions can be greater than about 50%, 60%, 70%, 80%, 90%, 91%, 92%, 93%, 94%, 95%, 96%, 97%, 98%, or 99%. In some instances, the multilayered or multitiered structures described also demonstrate compression set properties following one or more repeated deformations, typically compressions, at varying pressures up to about 50, 100, 200, 300, 400, 500 psi, or greater. Compression set of the multilayered or multitiered structures, expressed as a percentage value, following one or more compressions can be less than about 20%, 15%, 10%, 9%, 8%, 7%, 6%, 5%, 4%, 3%, 2%, 1%, 0.9%, 0.8%, 0.7%, 0.6%, 0.5%, 0.4%, 0.3%, 0.2%, or 0.1%.

6. Optional Thermal Conductive Fillers

As noted above, the polymer(s) used to form the polymeric protrusions and base may be entirely free or substantially free of any additives or fillers to increase thermal conductivity.

In instances where some thermal conductive filler or additive may be present, these thermally conductive materials or fillers can include, but are not limited to carbon black, carbon nanotubes (including any combination of single-walled, double-walled, or multi-walled carbon nanotubes), graphite, graphene, reduced graphene oxide, partially reduced graphene oxide, carbon fibers, carbon fibers coated with a metal or other conductive material such as nickel, ceramic fiber mesh, ceramics which includes for example: boron nitride, aluminum oxide, silicon carbide, aluminum nitride, aluminum trihydrate, magnesium hydroxide, metals such as aluminum, iron oxides, copper, stainless steel, etc., including metal foils. In some instances, the conductive materials or fillers are in the form of a plurality of particles where suitable particles can vary by size, type (such as crystal forms of hexagonal, rhombohedral, cubic, etc.), agglomerated particle size, aspect ratio, surface coatings that enhance surface physical properties of the particles, pH characteristics (e.g., acidic, basic, including Lewis acid or Lewis base particles), and particle blends. The particles may be spherical, non-spherical, or elongated particles and may be aligned along the major dimension of the polymeric protrusions. Higher aspect ratio particle shapes may also be used which include fibers, rods, needles, whiskers, ellipsoids, and flakes. The particles may be hollow, solid, or metal-coated particles. The size of the particles is selected to provide thermal conductivity, as well adequate distribution within the polymer (preferably uniform). In some cases, the particles have a major dimension of at least about 0.1 to 5 microns. The particles can have an aspect ratio greater than about 1 to 1 (major dimension to minor dimension), more preferably greater than about 1.25 or even 1.5 to 1. Elongated particles, for example, can have an aspect ratio greater than about 2 to 1, more preferably greater than about 5 to 1, 10 to 1, or even greater. In some instances, the conductive materials or fillers may be chosen in order to absorb or reduce interference at electromagnetic and/or radio frequencies (EMI/RFI). For example, particles of iron oxides and nickel-coated particles may be used for absorption or reduction of interference at electromagnetic and/or radio frequencies. In some instances, the low intrinsic electrical conductivity of the polymer protrusions may reduce the tendency of the heat sink to act as an antenna for unintended EM/RF transmission or absorption when compared to a similar structure composed of metallic protrusions.

In instances where some conductive filler or additive is included in the polymeric protrusions and/or base, the amounts added by weight of polymer used in fabrication is less than 5%, 4%, 3%, 2%, 1%, 0.9%, 0.8%, 0.7%, 0.6%, 0.5%, 0.4%, 0.3%, 0.2%, or 0.1% by weight of the additive to the weight of polymer.

B. Additional Base Properties

The polymeric base of the heat sinks may include one or more features selected to modify the flexibility of the base. For example, indentations, slits, channels, cut-outs, notches, holes, through holes, hinges, areas of differing thickness, or any combination thereof can be used to increase the flexibility of the base. Base flexibility can be varied by direction and based on design selection. For example, the flexibility can be higher in one direction. Features such as indentations, slits, channels, cut-outs, notches, holes, through holes, hinges, may also be added to avoid obstacles located near the desired attachment point of the heat sink.

The base is conformable and adaptable to contact a shaped surface. The base may include one or more cavities adapted to accept at least a portion of a heat-generating device or part thereof. The base can extend beyond the top surface of a heat-generating device, and optionally may be of a suitable size to cover at least a portion of one or more sides of the heat-generating device. The base can be corrugated or include a corrugated layer therein. The base can include a textured or contoured surface, such as to accommodate a selectively non-uniform surface.

The stiffness of the base can be below about 100,000 N/m, below about 50,000, 40,000, 30,000, or below about 20,000 N/m. In some instances, the stiffness of the base is below about 10000 N/m, below about 5, 4, 3, 2, 1, or 0.5 N/m.

The thermal conductivity of the base can be anisotropic where the thermal conductivity in the x-y plane of the base is higher than the thermal conductivity through the z-direction (thickness) of the base. The thermal conductivity in the x-y plane can be 10, 20, 50, or 100 times larger than the thermal conductivity in the z-direction of the base and the average thermal conductivity of the polymer heat sink.

The base may additionally include one or more optional additional layer(s) thereon. Additional optional layer(s) which may form part of the base or be placed on a surface of the base include, for example, a backing layer which can provide further functionality, such as to stabilize and/or reinforce the heat sink, provide resistance to stretching, improve tear resistance, add additional electrical isolation or electrical conductivity/grounding as well as a variety of other functions. A backing layer can, for example, be an adhesive layer used for attaching the heat sink to a foil or tape (if present) or to a surface of a heat-generating device. Additional optional layers, in addition to the backing layer, can also include an adhesive layer, a reinforcing layer, a heat spreading layer, an electrical shielding layer, a thermal interfacing layer, or a combination thereof. When the attachment is an adhesive bond a release liner can also be included with the base. In certain instances, where the base includes a foil or tape present on the base, the foil or tape may include one or more additional optional layer(s) as described herein. In some instances, the foil or tape may include an adhesive layer, and optionally a release liner, for attaching the heat sink to a surface of a heat-generating device. The adhesive may releasably bond or permanently bond the base of the heat sink to a surface of a device(s). Releasably bonding adhesives include, for example, materials that are reworkable, heat-releasable, stretch-releasable, solvent-releasable, and the like. Adhesive layers can include or be formed of any known adhesive, such as a pressure sensitive, thermosetting, thermoplastic, hot melt, or other thermal bond film, radiation-cured or curable, solvent-activatable or solvent-activated, low surface energy adhesive, and combinations thereof. Exemplary adhesives include epoxy adhesive and adhesive such as acrylate, silicone, polyester, and/or polyolefin adhesive(s), silicone and acrylate adhesives, combinations thereof and may also include appropriate known curing agents. The adhesive of the optional layer(s) on either the base or the foil or tape may be a uniform layer(s) or be formed of stripes or islands of adhesive(s). Any known adhesive chemistry can be used, such as epoxy, urethane, synthetic rubber, natural rubber, polyolefin, silicone, ionomer, cyanate ester, acrylic and combinations, intermittent regions, or layers thereof. The adhesive may include one or more known additives, usually included for a particular purpose such as reinforcing filaments, and thermally conductive particles. Examples of additives include flame-retardants, plasticizers, tackifiers, processing aids, antistatic agents, and oils. Useful flame-retardant additives include halogenated and non-halogenated organic compounds, organic phosphorus-containing compounds (such as organic phosphates), inorganic compounds, and inherently flame-retardant polymers. These additives are added to or incorporated into the adhesive.

In some cases, a notch of about 1×1 inch and depth of about 0.2, 0.3, 0.4, or 0.5 mm can be made in the base and filled with a phase change material (PCM), as described herein, as a way to add thermal storage capability to the base. The PCM cavity can be sealed by placing/adhering a foil or tape, described herein, over the filled base surface. With this the PCM is in direct contact with the metal foil that is efficiently interfacing it to the heat source. The cross section of the notch may be scaled to a larger or smaller dimension as appropriate to align with the dimensions of heat source(s) or heat generating devices.

III. Methods for Manufacturing Polymer-Based Heat Sinks

The heat sinks described herein can be formed according to the methods detailed herein.

In one non-limiting example, the method of preparing a heat sink includes the steps of:

(a) forming a base and a plurality of polymeric protrusions on at least a surface of the base.

In another non-limiting example, the method of preparing a heat sink includes the steps of:

(a) forming a base and a plurality of polymeric protrusions at least a surface of the base; and (b) attaching, adhering, or bonding to the base a foil or tape on a surface opposite the surface including the plurality of polymeric protrusions.

The heat sinks formed according to the methods can have any suitable dimensions needed to cover one or more surfaces of a heat-generating device (such as a computer chip or component).

A. Base and Polymeric Protrusions

Formation of a base and the polymeric protrusions can be carried out by any suitable means, such as by polymer extrusion into a mold. The polymeric protrusions are formed on at least one side/surface of the base. The polymeric protrusions which form part of the heat sink article are either formed together with the base or, alternatively, the polymeric protrusions may be formed onto a pre-formed base. The base includes the plurality of polymeric protrusions extending away from the base.

Suitable processes for forming the polymeric protrusions and the base include, but are not limited to, molding, vacuum forming, thermoforming, compression molding, continuous molding (replication), profile extrusion (through-molding), injection molding, embossing, cold forming, additive manufacturing, or combinations thereof.

The polymeric protrusions and/or base can be made according to the processes above from any known suitable polymer, such as, but not limited to, melt processable or extrudable polymer(s). Suitable examples include but are not limited to thermoplastic polymers, elastomeric polymers, thermosetting polymers, and thermoplastic elastomers. Two or more polymers may be used in combination, such as in layers and/or blends to form the polymeric protrusions. The thermoset polymers used to form the protrusions, for example, can be crosslinked via known means, such as chemical or thermal agents, catalysts, irradiation, heat, light, and combinations thereof. In some instances, the polymer(s) used to form the protrusions may be selected such that it has a glass transition temperature below about 25° C. in order for the polymer to not be completely hard and glassy at room temperature. In some instances, the polymeric protrusions and the base can be formed of one or more polymers, including but not limited to, those from the group consisting of polycarbonates, nylons, polypropylenes, styrene-ethylene-butylene-styrene or other styrenic block copolymers, polyurethanes, polyethylene terephthalate (including biaxially-oriented polyethylene terephthalate also known as Mylar), and blends thereof. In some instances, a phase change material (PCM), such as a paraffin wax, may be included inside (i.e., a core) of the polymeric protrusions to increase the thermal storage capacity. Phase change materials include, but are not limited to, paraffin waxes, polyethylene waxes, hydrocarbon-based waxes in general, and blends thereof. Other examples of phase change materials that are neither wax nor polymeric include liquid metals, oils, organic-inorganic and inorganic-inorganic eutectics, and blends thereof.

The polymer(s) used to form the protrusions and/or base may be entirely free or substantially free of any additives that increase thermal conductivity. "Substantially free," as used herein refers to less than 5%, 4%, 3%, 2%, 1%, 0.9%, 0.8%, 0.7%, 0.6%, 0.5%, 0.4%, 0.3%, 0.2%, or 0.1%, by weight of polymer to additive used to fabricate the polymeric protrusions and/or the base. The thermal conductivity of the polymeric protrusions and base can each independently range from about 0.01 to 0.5 W/m-K or can be less than about 0.5 W/m-K, 0.4 W/m-K, 0.3 W/m-K, 0.2 W/m-K, or 0.1 W/m-K. In some instances, the thermal conductivity can be in a range of between about 0.1-0.3 W/m-K or is below about 0.5 W/m-K. In some cases, the polymeric protrusions and/or base are formed of a nylon which is thermally non-conductive or has low thermal conductivity, such as in the range of between about 0.2 to 0.28 W/m-K. In some cases, the polymeric protrusions and/or base are formed of a polycarbonate which is thermally non-conductive or has low thermal conductivity, such as in the range of between about 0.19 to 0.22 W/m-K. In some cases, the polymeric protrusions and/or base are formed of a polypropylene which is thermally non-conductive or has low thermal conductivity, such as in the range of between about 0.17 to 0.27 W/m-K. In some cases, the polymeric protrusions and/or base are formed of a polyurethane which is thermally non-conductive or has low thermal conductivity, such as in the range of between about 0.17 to 0.25 W/m-K. In some cases, the polymeric protrusions and/or base are formed of a styrene-ethylene-butylene-styrene which is thermally non-conductive or has low thermal conductivity, such as in the range of between about 0.17 to 0.28 W/m-K.

The polymer(s) forming the polymeric protrusions and/or base of the heat sink may be the same, similar, or different. Typically, each of the polymeric protrusions of a heat sink are formed of the same or of substantially similar polymer compositions. "Substantially similar" means having a composition wherein at least about 85 weight percent (wt %), more preferably at least about 90 wt %, and in some embodiments at least about 95 wt %, of the substantially similar compositions are identical. In certain instances, each of the polymeric protrusions of a heat sink are formed from dissimilar polymer compositions where "dissimilar" means that the compositions can vary by more than about 15 wt %.

Molding, for example, can be used to form polymeric protrusions having parallel sidewalls (e.g., cylindrical), tapered sidewalls, or a combination thereof, which facilitates removal from a mold used in their manufacture. In a non-limiting example, selection of a suitable mold can be used to achieve polymeric protrusions having any desired dimension of the base and/or polymeric protrusions, as discussed in detail above in Section II listing exemplary dimensions sizes ranges, which are incorporated herein in relevant part by reference. A mold can contain a plurality of arranged cavities of a chosen size, shape, and orientation to form a plurality of polymeric protrusions and the base or the plurality of polymeric protrusions may be formed in the mold and a base may be subsequently formed thereon.

In methods where a foil or tape is included in the heat sink, the base and polymeric protrusions are formed and the foil or tape can be attached, adhered, or bonded to the base on a surface opposite the surface of the base having the protrusions thereon. Cavities may be arranged, sized, and shaped as desired to form a suitable surface structures from a polymeric material, as described above. Cavities of a mold may be formed in any suitable manner, such as one or more of chemical, electrical, and mechanical machining or forming processes. Examples include drilling, machining, laser drilling, e-beam drilling, water jet machining, casting, etching, die punching, diamond turning, engraving knurling, and the like. The placement of the cavities determines the spacing and orientation of the polymeric protrusion on the base of the heat sink.

The mold cavities can be open at the end of the cavity opposite the surface from which molten polymeric material is applied to facilitate injection of the polymeric material into the cavities. Vacuum can be applied to the cavity so that the molten polymeric material fills substantially the entire cavity. The mold cavities may be designed to facilitate release of the polymeric structures, and thus may include angled sidewalls, or include a release coating on the cavity walls. The mold surface may also include an optional release coating thereon selected to facilitate release of the polymeric protrusions and base from the mold.

Polymer(s) in a liquid state (i.e., molten) can be flowed into the mold cavities, and over the surface of the mold to form a layer of material, or a separate stream of polymeric material of the same or different composition can be used to form a layer of material. The polymeric material(s) are typically be heated to an appropriate temperature, and then filled into the cavities of the mold. This coating technique can be any conventional technique, such as calendar coating, cast coating, curtain coating, die coating, extrusion, gravure coating, knife coating, spray coating or the like. The addition of polymer(s) into a mold may be assisted by the application of pressure. The addition of polymer(s) into a mold may be assisted by evacuating the cavities of the mold before applying the polymeric material(s).

After the polymer(s) have been flowed into the cavities of the mold, the polymer(s) are cooled to solidify and form the desired topography of polymeric protrusions. In some instances, the base discussed above is placed onto the mold and the polymeric protrusions are formed directly onto the base after the polymer(s) are cooled and solidify. In other instances, the solidified polymer having the protrusions is separated from the mold and contacted, adhered, and/or bonded to a base, optionally by way of an adhesive. Part or the entirety of the mold may be cooled to aid in solidifying the polymeric material(s) forming the polymeric protrusion structures on a protrusion base layer, which is subsequently contacted, adhered, and/or bonded to the base of the heat sinks, optionally by way of an adhesive. Cooling can be effected directly or indirectly via any known means such as using water, air, other heat transfer fluids, or other cooling processes.

Some molding processes may use curable or thermoset polymers, such as those already described above. When such resins are used, the resin typically is applied to the mold as a liquid in an uncured or unpolymerized and/or molten state. After the resin has been coated onto the mold, it is polymerized or cured and cooled (if necessary) until the resin is solid. Generally, the polymerization process involves either a setting time, or exposure to an energy source, or both to facilitate the polymerization. The energy source can be heat or other radiation energy such as an electron beam, ultraviolet light, or visible light. After the resin is solidified, it can be removed from the mold. In some embodiments, it may be desired to further polymerize or cure the thermosetting resin after the polymeric protrusions are removed from the mold cavities. Examples of suitable thermosetting resins include melamine resins, formaldehyde resins, acrylate resins, epoxy resins, urethane resins, silicone resins, fluoropolymer resins, and combinations thereof.

Molds can be made from suitable materials that range from rigid to flexible. The mold components can be made of metal, ceramic, polymeric materials, or combinations thereof. The materials forming the mold must have sufficient integrity and durability to withstand the thermal energy associated with the particular flowable polymeric material used to form the polymeric protrusions and/or base and any surface features desired.

In other instances, other methods may be used to form the plurality of polymeric protrusions and/or base of the heat sink including, but not limited to vacuum forming, thermoforming, compression molding, continuous molding (replication), profile extrusion (through-molding), injection molding, embossing, cold forming, or combinations thereof can be used to achieve polymeric protrusions having a desired major dimension (height) and minor dimension (width) and distance between adjacent polymeric protrusions.

In many instances, the polymeric protrusions are formed directly onto the base where the protrusions and base are formed as a single piece of the same material. The polymeric protrusions can, alternatively, be attached to the base via molding where the base is contacted with a mold having cavities that are filled with polymeric material(s), as described above. Other suitable means for forming the polymeric protrusion directly on the base include additive manufacturing, melt bonding, solvent bonding, etc. In some instances, the polymeric protrusions may be formed separately onto its own protrusion base layer (formed from the same or different polymer(s) as the protrusions) which is then attached, adhered, or otherwise bonded to the base layer.

Attaching, adhering, or bonding a foil or tape, when present, to the base may be achieved with or without the application of pressure. Optionally, an adhesive or adhesive containing layer may be used to achieve the attachment or bonding of the foil or tape to the base's surface to provide the heat sink. Suitable adhesives are described throughout this disclosure. In some instances, common insert molding techniques are used to directly form polymeric protrusions and polymer base directly on foil or tape or with part or all of the foil or tape present inside the polymer base.

1. Optional Conductive Fillers

The polymer(s) used in the aforementioned methods of preparing a heat sink may be entirely free or substantially free of any additives or fillers to increase thermal conductivity. In instances where some conductive filler or additive is included in the polymeric protrusions and/or base, the amounts added by weight of polymer used in fabrication is less than 5%, 4%, 3%, 2%, 1%, 0.9%, 0.8%, 0.7%, 0.6%, 0.5%, 0.4%, 0.3%, 0.2%, or 0.1% by weight of the additive to the weight of polymer. In instances where some thermal conductive filler or additive is present, these thermally conductive materials or fillers can include, but are not limited to carbon black, carbon nanotubes (including any combination of single-walled, double-walled, or multi-walled carbon nanotubes), graphite, graphene, reduced graphene oxide, partially reduced graphene oxide, carbon fibers, carbon fibers coated with a metal or other conductive material such as nickel, ceramic fiber mesh, ceramics which includes for example: boron nitride, aluminum oxide, silicon carbide, aluminum nitride, aluminum trihydrate, magnesium hydroxide, metals such as aluminum, iron oxides, copper, stainless steel, etc., including metal foils. In some instances, the conductive materials or fillers are in the form of a plurality of particles where suitable particles can vary by size, type (such as crystal forms of hexagonal, rhombohedral, cubic, etc.), agglomerated particle size, aspect ratio, surface coatings that enhance surface physical properties of the particles, pH characteristics (e.g., acidic, basic, including Lewis acid or Lewis base particles), and particle blends. The particles may be spherical, non-spherical, or elongated particles and may be aligned along the major dimension of the polymeric protrusions. Higher aspect ratio particle shapes may also be used which include fibers, rods, needles, whiskers, ellipsoids, and flakes. The particles may be hollow, solid, or metal-coated particles. When adding conductive fillers, molding parameters may be tuned to give preferential alignment of the fillers, allowing conductivity to be maximized in the direction of heat transfer.

2. Optional Foil or Tape

The optional foil or tape which is on the base of the heat sink, as shown in FIG. 1B, and has a high thermal conductivity. The thermal conductivity of the foil or tape can range from about 5 to 1800 W/m-K, 5 to 700 W/m-K, 5 to 400 W/m-K, 5 to 200 W/m-K, 5 to 150 W/m-K, 5 to 100 W/m-K, 10 to 100 W/m-K, 10 to 75 W/m-K, or 5 to 100 W/m-K; or the thermal conductivity can be at least about 10 W/m-K, 20 W/m-K, 30 W/m-K, 40 W/m-K, 50 W/m-K, 60 W/m-K, 70 W/m-K, 80 W/m-K, or 100 W/m-K. Metals can be selected from aluminum, copper, alloys thereof, or combinations thereof. The foils or tapes may be formed of more than one layer of the metals, graphite, or polymers described. Foils or tapes of suitable thicknesses and sizes can be prepared according to known methods or purchased from commercial sources. Suitable thicknesses and sizes are as described above.

In some other instances, the foil or tape includes one or more additional layers (such as an adhesive layer) using known methods which is used to attach, adhere, or bond the foil or tape to the base surface. In some other instances, the base includes one or more additional layers (such as an adhesive layer) using known methods which is used to attach, adhere, or bond the foil or tape to the base surface. Suitable adhesives are described throughout this disclosure.

The optional foil or tape on the base of the heat sink, as shown in FIG. 1B, can be made of a dielectric polymer film with aligned crystal structure that has in-plane thermal conductivity greater than 10 W/m-K such as aligned high molecular weight polyethylene films.

The foil or tape present on the base can be free or substantially free carbon nanotubes in some instances wherein in "substantially free" means less than 5%, 4%, 3%, 2%, 1%, 0.9%, 0.8%, 0.7%, 0.6%, 0.5%, 0.4%, 0.3%, 0.2%, 0.1%, or less.

In still some other instances, the foil or tape present on the base can be formed to include carbon nanotubes according to the disclosure below.

a. Optional Foil or Tape including Carbon Nanotubes

The foil or tape containing carbon nanotubes is a thermal interface material (TIM), as described above. Such TIMs can be prepared as described below.

Carbon nanotube arrays can be prepared using techniques known in the art. In one embodiment, the arrays are prepared as described in U.S. Publication No. 2014-0015158-A1, incorporated herein by reference. This method involves the use of multilayer substrates to promote the growth of dense vertically aligned CNT arrays and provide excellent adhesion between the CNTs and metal surfaces.

Carbon nanotube sheets can be prepared using techniques well known in the art. In one embodiment, the sheets are prepared as described in U.S. Pat. No. 7,993,620 B2. In this embodiment, CNT agglomerates are collected into sheets in-situ inside the growth chamber on metal foil substrates. The sheets can then be densified by removing the solvent. In another embodiment, the CNT sheets are made by vacuum filtration of CNT agglomerates that are dispersed in a solvent.

b. Coated Nanotube Arrays and Sheets

1. Polymer Coatings

Polymers to be coated can be dissolved in one or more solvents and spray or dip coated or chemically or electrochemically deposited onto the vertical CNT forests or arrays grown on a substrate, or on a sheet, as described above. The coating materials can also be spray coated in powder form onto the top of vertical CNT forests or arrays grown on a substrate, or on CNT sheets as described above. The coatings includes polymers or molecules that bond to CNTs through van der Waals bonds, π-π stacking, mechanical wrapping and/or covalent bonds and bond to metal, metal oxide, or semiconductor material surfaces through van der Waals bonds, π-π stacking, and/or covalent bonds.

For spray or dip coating, coating solutions can be prepared by sonicating or stirring the coating materials for a suitable amount of time in an appropriate solvent. The solvent is typically an organic solvent or solvent and should be a solvent that is easily removed, for example by evaporation at room temperature or elevated temperature. Suitable solvents include, but are not limited to, chloroform, xylenes, hexanes, pyridine, tetrahydrofuran, ethyl acetate, and combinations thereof. The polymer can also be spray coated in dry form using powders with micron scale particle sizes, i.e., particles with diameters less than about 100, 50, 40, 20, 10 micrometers. In this embodiment, the polymer powder would need to be soaked with solvent or heated into a liquid melt to spread the powder particles into a more continuous coating after they are spray deposited.

The thickness of the coatings is generally between 1 and 1000 nm, preferably between 1 and 500 nm, more preferably between 1 and 100 nm, most preferably between 1 and 50 nm. In some embodiments, the coating thickness is less than 500, 450, 400, 350, 300, 250, 200, 150, 100, 90, 80, 70, 60, 50, 40, 30, 20 or 10 nm.

Spray coating process restricts the deposition of coating to the CNT tips and limits clumping due to capillary forces associated with the drying of the solvent. The amount of coating visible on the CNT arrays increases with the number of sprays. Alternative techniques can be used to spray coat the coating materials onto the CNT arrays including techniques more suitable for coating on a commercial scale.

In another embodiment that demonstrates a coating process, CNT sheets are dipped into coating solutions or melted coatings to coat CNTs throughout the thickness of the sheets, increasing the thermal conductivity of the sheet in the cross-plane direction by greater than 20, 30, 50, or 70%. These coated sheets are then placed between a chip and heat sink or heat spreader with the application of solvent or heat to reflow the polymer and bond the CNT sheet between the chip and heat sink or spreader to reduce the thermal resistance between the chip and heat sink or heat spreader.

In other embodiments, the coating material can be deposited on the CNT array or sheet using deposition techniques known in the art, such as chemical deposition (e.g., chemical vapor deposition (CVD)), aerosol spray deposition, and electrochemical deposition.

In one embodiment, a polymer coating can be applied by electrochemical deposition. In electrochemical deposition, the monomer of the polymer is dissolved in electrolyte and the CNT array or sheet is used as the working electrode, which is opposite the counter electrode. A potential is applied between the working and counter electrode with respect to a third reference electrode. The monomer is electrooxidized on the CNT array tips or sheet sidewalls that face the electrolyte as a result of the applied potential. Controlling the total time in which the potential is applied controls the thickness of the deposited polymer layer.

In some embodiments, the coating material is, or contains, one or more oligomeric and/or polymeric materials. In particular embodiments, the polymer can be a conjugated polymer, including aromatic and non-aromatic conjugated polymers. Suitable classes of conjugated polymers include polyaromatic and polyheteroaromatics including, but not limited to, polythiophenes (including alkyl-substituted polythiophenes), polystyrenes, polypyrroles, polyacetylenes, polyanilines, polyfluorenes, polyphenylenes, polypyrenes, polyazulenes, polynaphthalenes, polycarbazoles, polyindoles, polyazepines, poly(3,4-ethylenedioxythiophenes), poly(p-phenyl sulfides), and poly(p-phenylene vinylene). Suitable non-aromatic polymers include, but are not limited to, polyacetylenes and polydiacetylenes. The polymer classes listed above include substituted polymers, wherein the polymer backbone is substituted with one or more functional groups, such as alkyl groups. In some embodiments, the polymer is polystyrene (PS). In other embodiments, the polymer is poly(3-hexythiophene) (P3HT).

In other embodiments, the polymer is a non-conjugated polymer. Suitable non-conjugated include, but are not limited to, polyvinyl alcohols (PVA), poly(methyl methacrylates) (PMMA), polysiloxanes, polyurethanes, polydimethylsiloxanes (PDMS), and combinations (blends) thereof.

In other embodiments, the polymer is a paraffin wax. In other embodiments, the polymer is a synthetic wax such as Fischer-Tropsch waxes or polyethylene waxes. In other embodiments, the polymer is a wax that has a melting temperature above 80, 90, 100, 110, and 120° C., preferably above 130° C.

In some other embodiments, the polymer is an adhesive, such as, but not limited to, a hot glue or hot melt adhesive that combines wax, tackifiers and a polymer base to provide improved surface adhesion. In some embodiments, the adhesive is a pressure sensitive adhesive. In certain other embodiments the adhesive is a monomer that polymerizes upon contact with air or water such as a cyanoacrylate. In yet other embodiments, the adhesive is a combination of a pressure sensitive adhesive polymer and a thermally activated (or activatable) adhesive polymer which enhances ease of adhesion of a multilayered or multitiered structure described herein which includes such a combination of coatings to a surface(s), by way of the pressure sensitive adhesive and additional and more permanent or semi-permanent adhesion by way of the thermal adhesive.

2. Metallic Nanoparticles

The CNT arrays or sheets can be coated with one or more metal nanoparticles. One or more metal nanoparticles may be adsorbed to the distal ends and/or sidewalls of the CNTs to bond the distal ends of the CNTs to a surface, reduce thermal resistance between the CNT array or sheet and a surface, or combinations thereof. Metal nanoparticles can be applied to CNT arrays or sheets using a variety of methods known in the art. For example, a solution of metal thiolate such as palladium hexadecanethiolate can be sprayed or spin coated onto the distal ends and/or sidewalls of the CNTs, and the organics can be baked off to leave palladium nanoparticles. In another example, electron-beam or sputter deposition can be used to coat metal nanoparticles or connected "film-like" assemblies of nanoparticles onto the distal ends and/or sidewalls of the CNTs. The metallic particles can be coated simultaneously with the coating or before or after coating.

Examples of suitable metal nanoparticles include palladium, gold, silver, titanium, iron, nickel, copper, and combinations thereof.

3. Flowable or Phase Change Materials

In certain embodiments, flowable or phase change materials can be applied to the CNT array or sheet. Flowable or phase change materials may be added to the CNT array or sheet to displace the air between CNTs and improve contact between the distal ends of CNTs and a surface, and as a result reduce thermal resistance of the array or sheet and the contact between the array or sheet and a surface, or combinations thereof. Flowable or phase change materials can be applied to CNT arrays or sheets using a variety of methods known in the art. For example, flowable or phase change materials in their liquid state can be wicked into a CNT array or sheet by placing the array or sheet in partial or full contact with the liquid.

Examples of suitable flowable or phase change materials include paraffin waxes, polyethylene waxes, hydrocarbon-based waxes in general, and blends thereof. Other examples of suitable flowable or phase change materials that are neither wax nor polymeric include liquid metals, oils, organic-inorganic and inorganic-inorganic eutectics, and blends thereof. In some embodiments, the coating material(s) and the flowable or phase change material are the same.

The coatings, metallic particles, and/or flow or phase change materials described above can be applied directly to the CNT arrays or sheets and the coated CNT arrays or sheets can subsequently be stacked to form multilayered or multitiered structures. In certain other embodiments, the coatings, metallic particles, and/or flow or phase change materials described above are applied during the stacking of two or more CNT arrays or sheets. In still other embodiments, the coatings, metallic particles, and/or flow or phase change materials described above are applied following the stacking of two or more CNT arrays or sheets. In non-limiting embodiments, multilayered or multitiered structure(s) are formed by first stacking two or more CNT arrays or sheets and then the at least partially interdigitated tiers of the formed structures are infiltrated with one or more coatings, metallic particles, and/or flow or phase change materials, or combinations thereof. The introduction of such coatings/materials into the at least partially interdigitated tiers of the multilayered or multitiered structure(s) prior to, during, or after stacking can be used to modify and/or enhance the thermal transport or thermal resistance properties of the multilayered or multitiered structures resulting from the stacking of the CNT arrays or sheets.

c. Multilayered or Multitiered Structures

In the embodiments of the TIMS described herein, multilayered or multitiered structures are formed by stacking CNT arrays or sheets by a method including the steps of:

(1) providing at least two or more CNT arrays or sheets; and (2) stacking the at least CNT arrays or sheets wherein the stacking results in at least partial interdigitation of the nanostructures, CNTs, of the arrays or sheets. In some embodiments, the method of making the multilayered or multitiered structures further includes a step of applying or infiltrating a coating, a coating of metallic nanoparticles, and/or a coating of flowable or phase change materials, which are described above. In some embodiments, the step of applying or infiltrating a coating, a coating of metallic nanoparticles, and/or a coating of flowable or phase change materials occurs prior to stacking, alternatively during stacking, or alternatively after stacking. In yet other embodiments, the method includes applying pressure during the stacking step. The applied pressure may be in the range of about 1-100 psi, 1-50 psi, 1-30 psi, more preferably about 1-20 psi, and most preferably about 1-15 psi. In some embodiments, the pressure is about 15 psi. Pressure may be applied continuously until the adjacent tiers are bonded, if a coating material(s) which can act as a bonding agent, such as an adhesive or phase change material, is used. Pressure may be applied for any suitable amount of time. In some embodiments, only a short time is used, such as less than 1 minute, if no bonding agent is used.

At least two CNT arrays or sheets can be stacked to form the multilayered or multitiered structures. By using more CNT arrays the thickness of the multilayered or multitiered structures can be increased as needed. In some embodiments, up to 5, 10, 15, 20, 25, 30, or more CNT arrays or sheets can be stacked according to the method described above. The thickness of the resulting multilayered or multitiered structures formed by stacking can be in the range 1-10,000 microns or more.

In certain embodiments, the multilayered or multitiered structures can be formed by stacking multiple tiers of CNT arrays in a stepped manner, offset manner, and/or other non-uniform manner in order to be able to conform to complex surfaces.

In a non-limiting embodiment, at least two vertically aligned arrays or sheets formed on supports/substrates are stacked/contacted such that the nanostructure elements, such as CNTs, of the arrays at least partially interdigitate on contact. In one embodiment full interdigitation of nanostructure elements of the arrays occurs within one another when stacked. In other embodiments the arrays may interdigitate only at the tips of the nanostructure elements, such as CNTs. In yet other embodiments, the individual nanostructures can navigate through the nanostructures of the adjacent array during the interdigitating process.

In some embodiments the nanostructures of the stacked arrays, which interdigitate at least partially, may also form into larger superstructures, such as, but not limited to, tube bundles, clumps, or rows. These superstructures may be formed through mechanisms such as capillary clumping or by way of application of a polymer coating prior to, during, or following the stacking process.

In some embodiments, a polymer coating and/or adhesive, or other coating as described above, is applied to the CNT array(s) which are then stacked. In such embodiments, the thickness of the coating and/or adhesive, or other coating as described above, is about 1-1000 nm, more preferable 1-500 nm, and most preferably 1-100 nm.

In certain embodiments of the above method, following the stacking step the method further includes a step of applying an adhesive, such as but not limited to a hot glue or hot melt adhesive that combines wax, tackifiers and a polymer base to the resulting stack to provide improved adhesion properties to one or more surfaces of the stacked/tiered CNT arrays forming the multilayered or multitiered structure. In some embodiments, the adhesive is a pressure sensitive adhesive. In still other instances, the adhesive layer can include a double-sided pressure sensitive adhesive tape less than 0.5 mm in thickness. In yet other embodiments, the adhesive is a combination of a pressure sensitive adhesive polymer and a thermally activated (or activatable) adhesive polymer which enhances ease of adhesion of a multilayered or multitiered structure described herein which includes such a combination of coatings to a surface(s), by way of the pressure sensitive adhesive and additional and more permanent or semi-permanent adhesion by way of the thermal adhesive.

In yet other embodiments, one or more tiers of the stacked arrays described above may be substituted with other materials to afford a composite stack. Such materials include, but are not limited to, solders, greases, adhesives, phase change materials, gels, heat spreaders, compliant pads, and/or (elastomeric) gap pads. The substitution of these materials for one or more CNT array tiers of the multitiered or multilayered stacks can be used to further tune the properties of the resulting composite stack. Such composite stacks may be used for a variety of applications described below, such as thermal interface materials (TIMs).

IV. Heat Sink Applications

Figure 5:
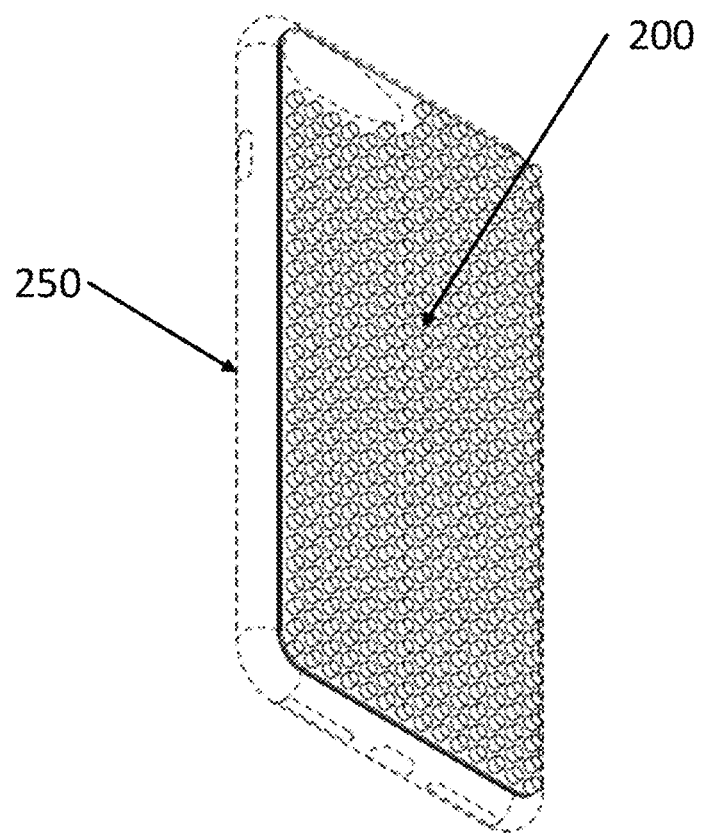
FIG. 5 shows a non-limiting representation of a plastic heat sink 200 on the rear/back of a cellphone case 250 depicted in dotted lines, where heat sink 200 optionally includes a foil or tape present below the base of the heat sink (not shown).
Figure 6A:
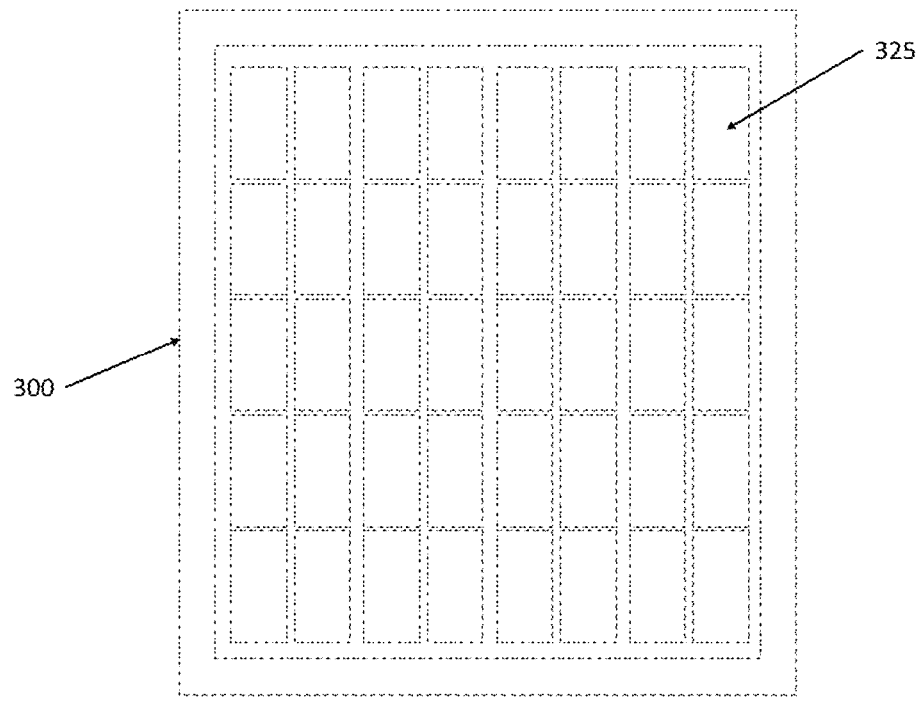
FIG. 6A shows a non-limiting representation of the front view of solar panel 300 having a plurality of solar cells 325 therein where the back of the solar panel has a plastic heat sink (not shown) attached thereto.
Figure 6B:
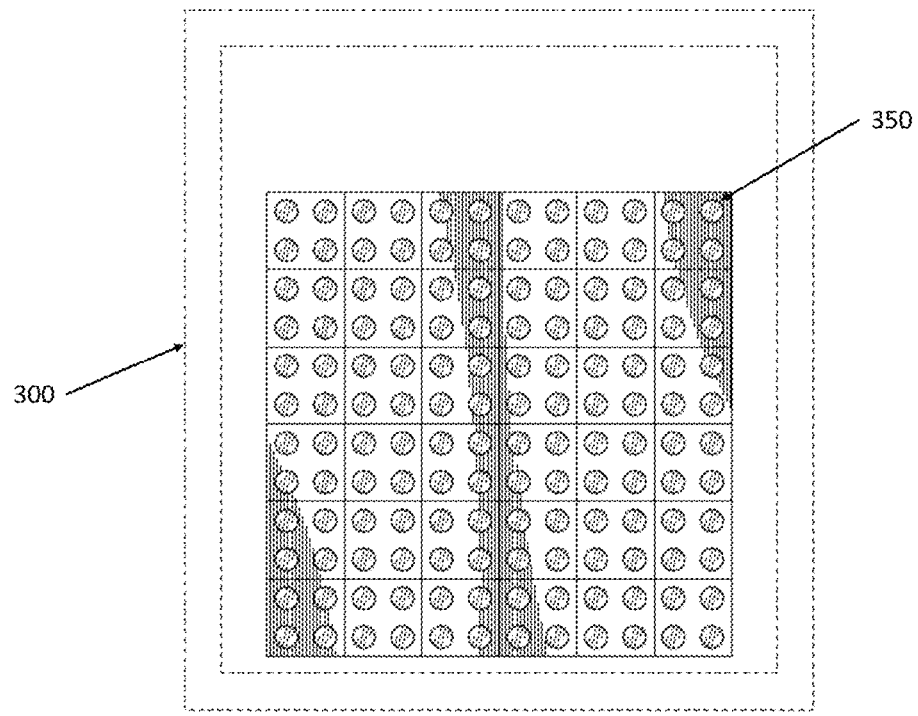
FIG. 6B shows a non-limiting representation of the rear view of solar panel 300 where a plastic heat sink 350 is attached thereon, where heat sink 350 optionally includes a foil or tape present below the base of the heat sink (not shown).
Figure 7:
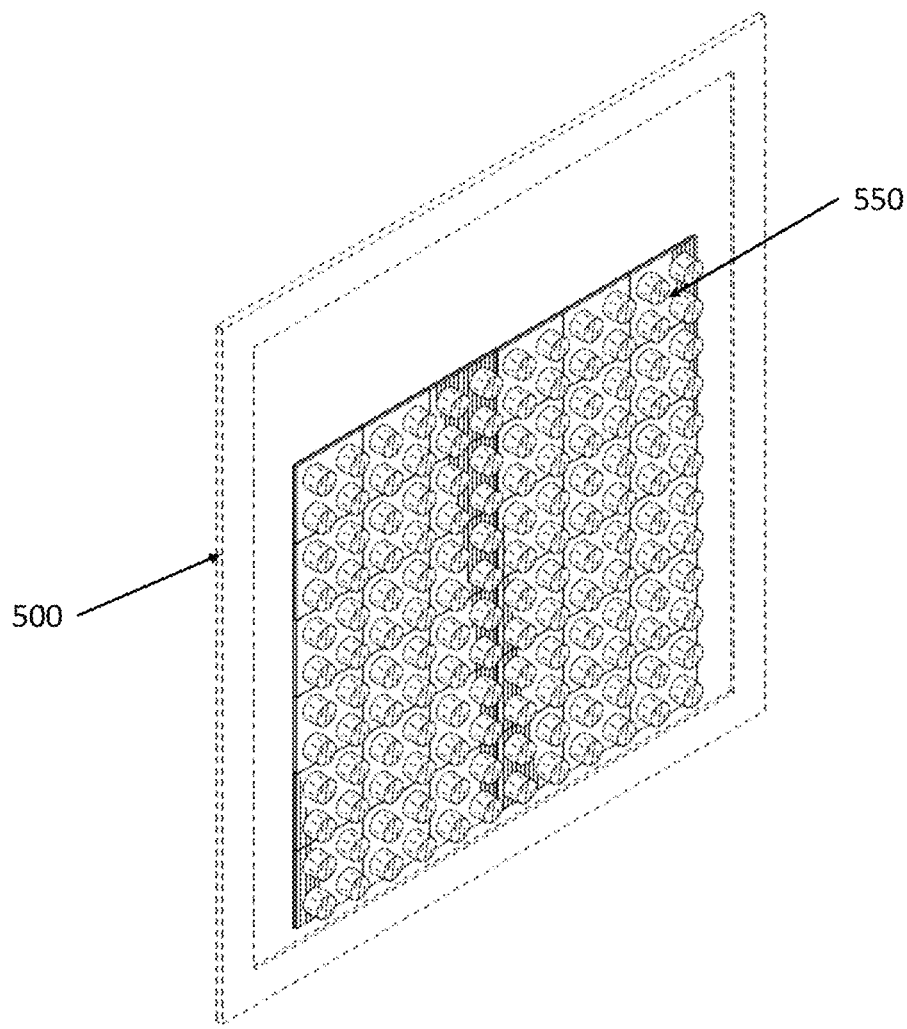
FIG. 7 shows a non-limiting representation of an electromagnetic interference (EMI) enclosure 500 having a plastic heat sink 550 attached thereon, where heat sink 550 optionally includes a foil or tape present below the base of the heat sink (not shown).

The heat sinks described above are flexible and conformable. Accordingly, such heat sinks are well suited for applications where the heat sink can conform to heat sources or heat-generating devices (or components thereof). The heat source or heat generating device or component thereof can be a computer chip, computer module, a multi-component system, memory module, graphics chip, radar and radio-frequency (RF) device, disc drive, display, light-emitting diode (LED) display, lighting device, pipe, automotive control unit, solar cell, solar panels, electromagnetic interference (EMI) enclosures, battery, communications device, thermoelectric generator, an imaging device, cellular phone, tablet or handheld computer, power or signal amplifier, AC/DC converter or other power electronics device. As shown in FIG. 5, a plastic heat sink 200 may be affixed on or form part of the rear of a cellphone: case 250. In certain cases, the heat sink may be attached to the rear surface of a solar panel (i.e., opposite where the surface including solar cells thereon), as shown in FIGS. 6A and 6B. In certain cases, the heat sink may be placed inside or on an EMI enclosure, as shown in FIG. 7. The heat sinks shown in FIGS. 6A-B and FIG. 7 may optionally include a foil or tape present below the base of the heat sink (not shown).

Figure 8:
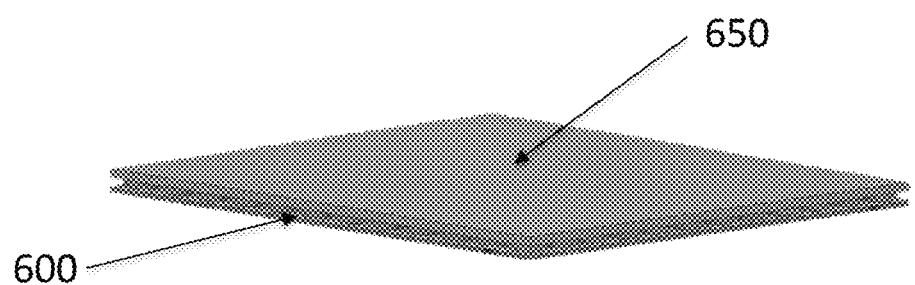
FIG. 8 shows a non-limiting representation of a plastic heat sink 600 having an optional lid 650 disposed on top of the polymeric protrusions of the heat sink, where heat sink 650 optionally includes a foil or tape present below the base of the heat sink (not shown).

The heat sinks described above, in certain instances, may further include an optional lid placed on top of the polymeric protrusions of the heat sinks (see FIG. 8), where the lid increases the thermal resistance of the heat sink by about 1, 2, or 3%. The optional lid can be used to block and/or reflect sun light which warms a heat generating device, such as a cell phone, which is exposed to sun light. The optional lid can be made of metals, such as aluminum, steel, copper, alloys thereof, or plastics polypropylene, polycarbonate, thermoplastic elastomer, polyurethane, Styrene-Ethylene-Butylene-Styrene, Acrylonitrile Butadiene Styrene.

The optional lid can have a thickness ranging from between about 0.02 mm to 10 mm, preferably 0.1 mm to 0.3 mm, and can be attached to the top of the heat sink polymeric protrusions with, for example, mechanical fastening, gluing, or another known method, such that the solid optional lid sits on top of all the polymeric protrusions and forces air to flow in and out from the sides of the heat sink. In such an instance, the optional lid can be applied with very little change to the thermal resistance of the heat sink. The optional lid can absorb or reflect radiation including sun light to keep this energy input from absorbing directly into the heat sink, and thus allowing another way to control the temperature of the heat generating device being cooled by the heat sink. The dimensions of the optional lid can suited to be any size necessary to cover all of the polymeric protrusions of a heat sink or can be selected to cover less, such as 90%, 80%, 70%, 60%, 50%, 40%, 30%, 20%, or 10% of the area formed by the polymeric protrusions of the heat sink. In certain instances (not shown), the optional lid is attached by polymeric protrusions that go through the optional lid in selected locations and align with holes in the center of the heat sink polymeric protrusions where, for example, fastening pins can be anchored. In one instance, the optional lid can be used on the back of a heat sink which forms part of a cellphone case, such as shown in FIG. 5, to block solar radiation from heating the cell phone through the back of the cellphone case. In one instance, the lid can act as a mount or holder for the cellphone and case, such as in a car mount in an automobile.

The heat sink may also be attached to sources of waste heat, such as hot pipes for temperature control or energy extraction. The heat sink can be abutted or adhered to the heat generating device or source to improve the transfer of heat from the heat generating device or source. The heat sinks are well suited for fitting into complex and/or volume constrained devices, sources, components, or packages.

The flexible and conformable heat sinks allow for intimate contact between surface(s) of heat generating devices or sources, as the surfaces may be curved, bent, bowed, or be otherwise deformed by design or due to thermal expansion(s) of the devices or sources.

The heat sinks can be applied to node multi-chip modules (MCMs). The flexible and conformable heat sinks allow for uniform or essentially uniform contact with MCMs. In certain instances, it can be difficult to predict or model warpage which may occur in individual chips, circuits, or MCMs during operation at normal temperatures. Warpage can lead to defects and even to failure in certain instances. Accordingly, the heat sinks are particularly suitable for such applications because they can be readily adjusted/reformed, if needed, to meet the tolerances required for such applications. As microchips heat up, they can warp leading to a center to-edge warpage greater than 50 µm whereas in multichip applications, the heat sinks here can accommodate chip-to-chip offsets of 100 µm or more and/or can also accommodate chip center-to-edge warpages of greater than 50 µm.

The heat sinks can be used with personal computers and components thereof, server computers and components thereof, memory modules, graphics chips, radar and radio-frequency (RF) devices, disc drives, displays, including light-emitting diode (LED) displays, lighting systems, pipes, automotive control units, power-electronics, solar cells, solar panels, electromagnetic interference (EMI) enclosures, batteries, communications equipment, such as cellular phones, thermoelectric generators, and imaging equipment, including MRIs.

The heat sinks can be dielectric and may be used in the vicinity of electronic components that require isolation from adjacent components without the need for additional measures such as the application of dielectric tapes or films that may increase cost or interfere with heat transfer.

The heat sinks can be fabricated in a standard form or shape such as a square or rectangle to facilitate low cost mass manufacture, while also being easily cut after manufacture to complex geometries to fit within the housing of the end use application, or to avoid obstacles (such as adjacent components) within the system without the need for customization prior to manufacture.

The heat sinks act as efficient heat spreaders when a sufficient number of tiers (i.e. 1, 2, 3, 4, 5, or more tiers) are present in the TIM and provide an in-plane thermal conductivity which is on par with that of the base material of the substrate, which is typically a metal.

In certain embodiments, the heat sinks may be used at temperatures which are above ambient temperature, at ambient temperature, below ambient temperature, below freezing, or at cryogenic temperatures.

The heat sinks can also be used for reducing unwanted antenna effects that may propagate electromagnetic and/or radio frequency signals.

The heat sinks may be used to conform around obstacles such as adjacent components on a printed circuit board, or an electromagnetic interference (EMI) shielding enclosure, without the need for a gap filling pad to make up the difference in height between the heat generating component and the obstacles near said component. With a sufficiently low profile of, for example, less than 10 mm, the heat sink may be placed inside of an EMI shielding enclosure, as opposed to above the enclosure or penetrating the enclosure's lid. When placed inside an EMI enclosure the need to include holes or other penetrations in the lid of the enclosure, or gap pads to make contact to the lid of the enclosure is eliminated.

The heat sinks may form part of a larger flexible structure for use in a device, such as a cellular phone or tablet, which requires heat removal or dissipation thereof from heat generating component(s) therein. The heat sink portion of the structure is designed to navigate heat away from the heat-generating component(s) where the heat escapes the device. The structure can provide a protective cover for the device and refers to an enclosure, or housing, that can also protect the device in the event the device is dropped. The larger flexible structure which the heat sink is a part of can be formed of any suitable material (i.e., plastic, wood, metal, etc.) and may be formed to dimensions suited for any commercially available device. The heat sink can be positioned on an interior surface of the structure which contacts one or more heat generating surfaces of a device (for example, a back surface which heats up during operations and/or charging). The polymeric protrusions of the heat sink typically face away from the device's heat generating surface(s) and the base, optionally including a foil or tape, are in direct or indirect contact with all or at least a portion of the device's heat generating surface(s). The heat sink forming part of the larger structure may prevent overheating of the device.

The heat sinks described may be attached to radiator panels in spacecraft, satellites, or other systems reliant on radiative cooling to increase surface area for heat rejection and associated heat transfer rates.

EXAMPLES

Example 1: Comparison of Plastic and Aluminum Heat Sinks

Materials and Methods

A 2" by 2" nylon heat sink having polymeric protrusions of 0.25" in height and having a volume of 1 in$^2$, a weight of 7.80 g with either a 1 mm copper foil or 65 micron aluminum foil with polymer encapsulated carbon nanotube (CNT) array was compared to a 1.6" by 1.5" aluminum heat sink having fins of 0.75" in height. The plastic heat sink and aluminum heat sink were compared under various configurations for integration including as a heat spreader; a plain heat sink.

Heat sinks described above were tested according to JESD51-14 standard using a TO-247 diode as a heat source under natural convection conditions.

Results

The plastic heat sink demonstrated comparable performance to the aluminum heat sink that had significantly larger overall volume and weight. Table 1 below lists the measured absolute thermal resistance of the heat sinks tested.

TABLE 1

Heat transfer Properties

| | R[K/W] | |
| --- | --- | --- |
| | 30 psi contact pressure between heat sink and diode | 60 psi contact pressure between heat sink and diode |
| Aluminum Heat Sink | — | 2.28 |
| Flexible Heat Sink + Copper Spreader | 4.50 | 4.09 |
| Flexible Heat Sink | — | 12.65 |

"—" denotes not tested

Figure 9:
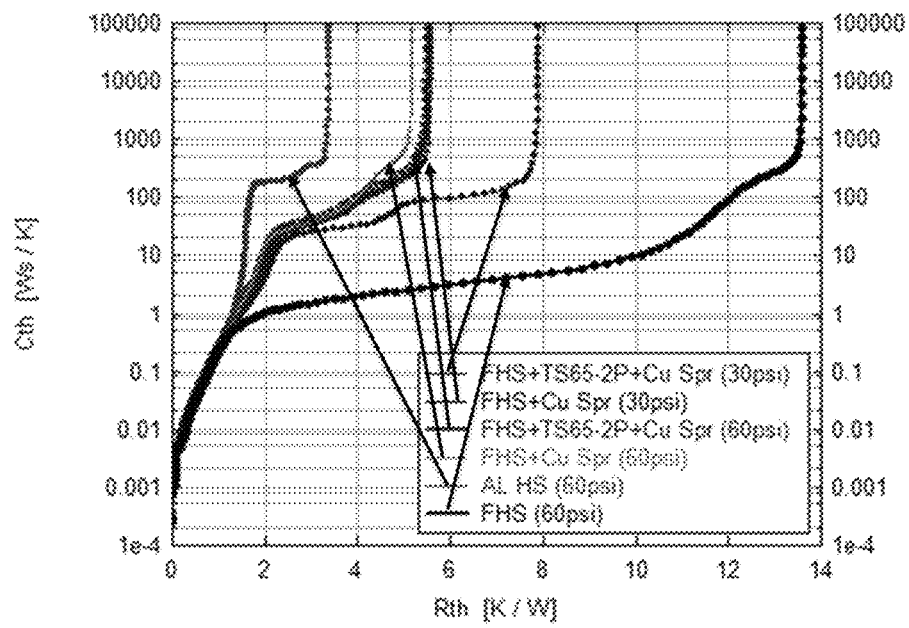
FIG. 9 is a graph of the absolute thermal resistance (x-axis; K/W) as a function of system capacitance (y-axis; Ws/K) for different heat sinks including a flexible heat sink with copper spreader (denoted FHS+Cu Spr) at 30 or 60 psi or in further combination with TS65-2P (65 μm thick, polymer encapsulated, carbon nanotube sheet coated on both sides with pressure sensitive adhesive) at those respective pressures; an aluminum heat sink (denoted AL HS) alone at 60 psi; and a flexible heat sink (FHS) alone at 60 psi.

FIG. 9 represents is a graph of the absolute thermal resistance (x-axis; K/W) as a function of system capacitance (y-axis; Ws/K) for different heat sinks including a flexible heat sink with copper spreader (denoted FHS+Cu Spr) at 30 or 60 psi or in further combination with TS65-2P (65 μm thick, polymer encapsulated, carbon nanotube sheet coated on both sides with pressure sensitive adhesive) at those respective pressures; an aluminum heat sink (denoted AL HS) alone at 60 psi; and a flexible heat sink (FHS) alone at 60 psi. The rightmost point of each curve represents the total system thermal resistance including diode, interfaces, heat sink and any intermediate materials such as a copper heat spreader (y-axis).

Example 2: Comparison of Plastic and Aluminum Heat Sinks

Materials and Methods

A flexible plastic heat sink (as described in Example 1) and an aluminum heat sink (as described in Example 1) were tested on a 1"×1" film heater. The flexible plastic heat sink and aluminum heat sinks were each tested separately when attached to a film heater with a TS65-2S and 3M 8805 commercial adhesive, respectively.

10 V (1 W) was applied to the film heater for 10 minutes and temperature was recorded for each material tested every 30 seconds.

Results

Figure 10:
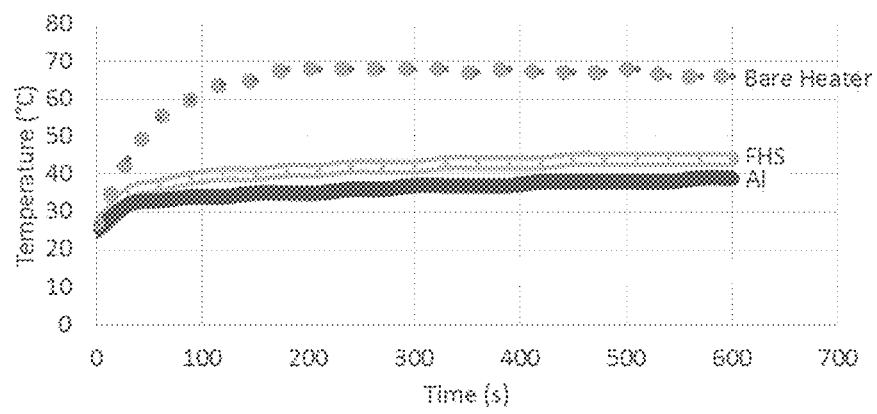
FIG. 10 is a graph showing the temperature in degrees Celsius (y-axis) of a flexible plastic heat sink (denoted FHS), aluminum heat sink (denoted Al), and bare heater as a function of time in seconds (x-axis).

The flexible plastic heat sink demonstrated improved performance to the aluminum heat sink. Table 2 below lists the measured absolute thermal resistance of the heat sinks tested. FIG. 10 shows the temperature (y-axis) as a function of time (x-axis) of the flexible plastic heat sink, aluminum heat sink, and bare heater.

TABLE 2

Heat transfer Properties

| | R[K/W] |
| --- | --- |
| Aluminum Heat Sink | 7.1 |
| Flexible Plastic Heat Sink | 11.1 |

Unless defined otherwise, all technical and scientific terms used herein have the same meanings as commonly understood by one of skill in the art to which the disclosed invention belongs. Publications cited herein and the materials for which they are cited are specifically incorporated by reference.

Those skilled in the art will recognize, or be able to ascertain using no more than routine experimentation, many equivalents to the specific embodiments of the invention described herein. Such equivalents are intended to be encompassed by the following claims.

We claim:

1. A plastic heat sink comprising:
a plurality of polymeric protrusions extending away from a polymeric base; wherein the plurality of polymeric protrusions and/or the polymeric base are formed from a polymer having a thermal conductivity of less than 0.5 W/m-K;
wherein the plurality of polymeric protrusions and the polymeric base are free or substantially free of additives that increase thermal conductivity;
wherein the polymeric base has a thickness ranging from between about 0.1 to 3 mm, 0.1 to 2 mm, 0.1 to 1 mm, or 0.5 to 1 mm;
wherein the plastic heat sink has a thermal resistance of less than about 500 cm$^2$ K/W; and
wherein the plastic heat sink has a thermal conductivity of less than 0.5 W/m-K.

2. The plastic heat sink of claim 1, wherein the plurality of polymeric protrusions and/or the polymeric base are formed from thermoplastic polymers, elastomeric polymers, thermoset polymers, thermoplastic elastomers, and combinations thereof.

3. The plastic heat sink of claim 1, wherein the plurality of polymeric protrusions and/or the polymeric base are formed from a polymer selected from the group consisting of polycarbonates, nylons, polypropylenes, polyethylene terephthalate, polyurethanes, styrene-ethylene-butylene-styrene, and blends thereof.

4. The plastic heat sink of claim 1, wherein the polymeric protrusions and/or the polymeric base can each independently have a thermal conductivity in a range from between about 0.01 to 0.5 W/m-K or less than about 0.5 W/m-K, 0.4 W/m-K, 0.3 W/m-K, 0.2 W/m-K, or 0.1 W/m-K.

5. The plastic heat sink of claim 1, wherein the plastic heat sink has a thermal conductivity in a range from between about 0.01 to 0.5 W/m-K or less than about 0.5 W/m-K, 0.4 W/m-K, 0.3 W/m-K, 0.2 W/m-K, or 0.1 W/m-K.

6. The plastic heat sink of claim 1, wherein the plurality of polymeric protrusions and/or the polymeric base are formed from a polymer selected from the group consisting of nylons, polypropylenes, polyurethanes, styrene-ethylene-butylene-styrene, and blends thereof.

7. The plastic heat sink of claim 1, wherein the plastic heat sink is flexible and conformable.

8. The plastic heat sink of claim 1, wherein the thickness of the polymeric base is about 0.1, 0.2, 0.3, 0.4, 0.5, 0.6.0.7, 0.8, 0.9, 1, 1.5, 2, 2.5, or 3 mm.

9. The plastic heat sink of claim 1, wherein a ratio of the polymeric base thickness to the polymeric protrusions height is at least 1:4, at least 1:5, at least 1:6, at least 1:7, at least 1:8, at least 1:9, or at least 1:10.

10. The plastic heat sink of claim 1, wherein the polymeric protrusions which are adjacent have center-to-center separation distances in a range of between about 3 to 15 mm, 5 to 15 mm, 5 to 10 mm or are at least about 5, 6, 7, 8, 9, or 10 mm.

11. The plastic heat sink of claim 1, wherein the plastic heat sink has a thermal resistance of less than about 250 cm$^2$ K/W.

12. The plastic heat sink of claim 1, wherein the polymeric base includes one or more additional layers thereon opposite the surface having thereon the polymeric protrusions.

13. The plastic heat sink of claim 12, wherein the one or more additional layers is a foil or tape and the foil or tape comprises aluminum, copper, alloys thereof, graphite, a crystalline polymer, or combinations thereof.

14. The plastic heat sink of claim 12, wherein the one or more additional layers is a foil or tape and the foil or tape has a thermal conductivity in a range from between about 5 to 1800 W/m-K, 5 to 700 W/m-K, 5 to 400 W/m-K, 5 to 200 W/m-K, 5 to 150 W/m-K, 5 to 100 W/m-K, 10 to 75 W/m-K, or 5 to 100 W/m-K; or of at least about 10 W/m-K, 20 W/m-K, 30 W/m-K, 40 W/m-K, 50 W/m-K, 60 W/m-K, 70 W/m-K, 80 W/m-K, or 100 W/m-K.

15. A method of making the plastic heat sink according to claim 1, the method comprising the steps of:
   (a) forming a polymeric base and a plurality of polymeric protrusions on at least a surface of the base;
   wherein the plurality of polymeric protrusions and/or the polymeric base are formed from a polymer having a thermal conductivity of less than 0.5 W/m-K;
   wherein the plurality of polymeric protrusions and the polymeric base are free or substantially free of additives that increase thermal conductivity; and
   wherein the polymeric base has a thickness ranging from between about 0.1 to 3 mm, 0.1 to 2 mm, 0.1 to 1 mm, or 0.5 to 1 mm;
   wherein the plastic heat sink has a thermal resistance of less than about 500 cm$^2$ K/W; and
   wherein the plastic heat sink has a thermal conductivity of less than 0.5 W/m-K.

16. The method of claim 15, wherein the plurality of polymeric protrusions and/or the polymeric base are formed from thermoplastic polymers, elastomeric polymers, thermoset polymers, thermoplastic elastomers, and combinations thereof.

17. The method of claim 15, wherein the plurality of polymeric protrusions and/or the polymeric base are formed from a polymer selected from the group consisting of polycarbonates, nylons, polypropylenes, polyethylene terephthalate, polyurethanes, styrene-ethylene-butylene-styrene, and blends thereof.

18. The method of claim 15, wherein the plurality of polymeric protrusions have tapered sidewalls.

19. The method of claim 15, wherein the polymeric protrusions or the polymeric base can each have a thermal conductivity in a range from between about 0.01 to 0.5 W/m-K or less than about 0.5 W/m-K, 0.4 W/m-K, 0.3 W/m-K, 0.2 W/m-K, or 0.1 W/m-K.

20. The method of claim 15, wherein the plastic heat sink has a thermal conductivity in a range from between about 0.01 to 0.5 W/m-K or less than about 0.5 W/m-K, 0.4 W/m-K, 0.3 W/m-K, 0.2 W/m-K, or 0.1 W/m-K.

21. The method of claim 15, wherein the plurality of polymeric protrusions and/or the polymeric base are formed from a polymer selected from the group consisting of nylons, polypropylenes, polyurethanes, styrene-ethylene-butylene-styrene, and blends thereof.

22. The method of claim 15, wherein the plastic heat sink is flexible and conformable.

23. The method of claim 15, wherein the thickness of the polymeric base is about 0.1, 0.2, 0.3, 0.4, 0.5, 0.6, 0.7, 0.8, 0.9, 1, 1.5, 2, 2.5, or 3 mm.

24. The method of claim 15, wherein a ratio of the polymeric base thickness to the polymeric protrusions height is at least 1:4, at least 1:5, at least 1:6, at least 1:7, at least 1:8, at least 1:9, or at least 1:10.

25. The method of claim 15, wherein the polymeric protrusions which are adjacent have center-to-center separation distances in a range of between about 3 to 15 mm, 5 to 15 mm, 5 to 10 mm or are at least about 5, 6, 7, 8, 9, or 10 mm.

26. The method of claim 15, wherein a sheet of the formed heat sink of step (a) is cut into a dimension and/or shape.

27. The method of claim 26, wherein the cut heat sink has a repeating geometry of protruding pins which is the same as the sheet of the formed heat sink of step (a).

28. The method of claim 15, further comprising the step of:
   (b) attaching, adhering, or bonding to the polymeric base a foil or tape on a surface opposite the surface comprising the plurality of polymeric protrusions.

29. The method of claim 28, wherein the foil or tape comprises aluminum, copper, alloys thereof, graphite, a crystalline polymer, or combinations thereof.

30. The method of claim 28, wherein the foil or tape has a thermal conductivity in a range of between about 5 to 1800 W/m-K, 5 to 700 W/m-K, 5 to 400 W/m-K, 5 to 100 W/m-K, 10 to 100 W/m-K, 10 to 75 W/m-K, or 5 to 100 W/m-K; or of at least about 10 W/m-K, 20 W/m-K, 30 W/m-K, 40 W/m-K, 50 W/m-K, 60 W/m-K, 70 W/m-K, 80 W/m-K, or 100 W/m-K.

* * * * *